(12) United States Patent
Lim et al.

(10) Patent No.: US 11,443,965 B2
(45) Date of Patent: Sep. 13, 2022

(54) WAFER TO WAFER BONDING APPARATUSES

(71) Applicant: Samsung Electronics Co., Ltd., Suwon-si (KR)

(72) Inventors: Kyeongbin Lim, Yongin-si (KR); Hyeonjun Yun, Seoul (KR); Gwanghee Jo, Hwaseong-si (KR); Jewon Lee, Hwaseong-si (KR); Minsoo Han, Hwaseong-si (KR); Junhyung Kim, Yongin-si (KR); Seungdae Seok, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 262 days.

(21) Appl. No.: 16/747,783

(22) Filed: Jan. 21, 2020

(65) Prior Publication Data

US 2021/0005475 A1 Jan. 7, 2021

(30) Foreign Application Priority Data

Jul. 2, 2019 (KR) ........................ 10-2019-0079283

(51) Int. Cl.
*H01L 21/67* (2006.01)
*H01L 21/683* (2006.01)
(Continued)

(52) U.S. Cl.
CPC .... *H01L 21/67092* (2013.01); *H01L 21/2007* (2013.01); *H01L 21/67253* (2013.01);
(Continued)

(58) Field of Classification Search
CPC ........... H01L 21/2007; H01L 21/67259; H01L 21/6838; H01L 24/75; H01L 2224/75744;
(Continued)

(56) References Cited

U.S. PATENT DOCUMENTS

| 6,350,738 B1 | 2/2002 | Savage et al. |
| 6,486,148 B2 | 11/2002 | Savage et al. |

(Continued)

FOREIGN PATENT DOCUMENTS

| JP | 5139609 B2 | 2/2013 |
| KR | 10-0994494 B1 | 11/2010 |
| KR | 10-1268898 B1 | 5/2013 |

*Primary Examiner* — Thanhha S Pham
(74) *Attorney, Agent, or Firm* — Harness, Dickey & Pierce, P.L.C.

(57) ABSTRACT

A wafer bonding apparatus includes lower and upper stages, lower and upper push rods, a position detection sensor, and processing circuitry. The stages may vacuum suction respective wafers on respective surfaces of the stages based on a vacuum pressure being supplied to respective suction holes in the respective surfaces from a vacuum pump. The push rods are movable through respective center holes in the stages to apply pressure to respective middle regions of the respective wafers. The position detection sensor may generate information indicating a bonding propagation position of the wafers based on detecting at least one wafer through a detection hole in at least one stage. The processing circuitry may process the information to detect the bonding propagation position and cause a change of at least one of a ratio of protruding lengths of the push rods, or a ratio of suction areas of the stages.

20 Claims, 18 Drawing Sheets

(51) Int. Cl.
*H01L 23/00* (2006.01)
*H01L 21/20* (2006.01)

(52) U.S. Cl.
CPC .... *H01L 21/67259* (2013.01); *H01L 21/6838* (2013.01); *H01L 24/75* (2013.01); *H01L 2224/75744* (2013.01); *H01L 2224/75745* (2013.01); *H01L 2224/808* (2013.01)

(58) Field of Classification Search
CPC ..... H01L 2224/75745; H01L 2224/808; H01L 24/94; H01L 2224/75701; H01L 2224/75702; H01L 2224/759; H01L 2224/94; H01L 24/80; H01L 21/185; H01L 2224/75753; H01L 2224/75802; H01L 2224/75804; H01L 21/68
See application file for complete search history.

(56) References Cited

U.S. PATENT DOCUMENTS

| | | |
|---|---|---|
| 6,767,904 B2 | 7/2004 | Savage et al. |
| 7,598,234 B2 | 10/2009 | Savage et al. |
| 7,765,682 B2 | 8/2010 | Hwang et al. |
| 8,822,307 B2 | 9/2014 | Yamaguchi et al. |
| 9,064,910 B2 | 6/2015 | Kinouchi et al. |
| 10,833,047 B2 * | 11/2020 | Kim ................ H01L 24/75 |
| 2018/0047699 A1 | 2/2018 | Omori et al. |
| 2018/0158796 A1 | 6/2018 | Otsuka et al. |
| 2019/0019677 A1 | 1/2019 | Kurz et al. |
| 2019/0019678 A1 | 1/2019 | Wagenleitner et al. |

* cited by examiner

WAFER TO WAFER BONDING APPARATUSES

CROSS-REFERENCE TO RELATED APPLICATION

This application claims priority under 35 U.S.C. § 119 to Korean Patent Application No. 10-2019-0079283, filed on Jul. 2, 2019 in the Korean Intellectual Property Office (KIPO), the contents of which are herein incorporated by reference in their entirety.

BACKGROUND

1. Field

Some example embodiments relate to wafer to wafer bonding methods and wafer to wafer bonding apparatuses. More particularly, some example embodiments relate to methods of bonding wafers to each other to manufacture a semiconductor device having a three-dimensional connection structure and wafer to wafer bonding apparatuses for performing the same.

2. Description of the Related Art

In manufacturing electronic products such as CIS (CMOS image sensor), HBM (High Bandwidth Memory), etc., two wafers may be bonded to each other, thereby improving a yield rate per wafer. The wafer to wafer bonding process may include an $O_2$ plasma activation step, a hydration step, a wafer alignment step, a wafer bonding step, an annealing step, etc. Since in the wafer bonding step, a middle region of the wafer may be deformed to protrude and then may be joined gradually from the middle region to a peripheral region, the wafers may be deformed due to self-weight during bonding propagation of the wafers, such that curvatures of the wafers at adhesion points are asymmetric to each other, thereby causing an alignment error.

SUMMARY

Some example embodiments provide a wafer to wafer bonding method capable of preventing wafer to wafer misalignment.

Some example embodiments provide a wafer to wafer bonding apparatus for performing the wafer to wafer bonding method.

According to some example embodiments, a wafer bonding apparatus may include a vacuum pump; a lower stage having a first surface and including a plurality of first suction holes in the first surface, wherein the lower stage is configured to vacuum suction a first wafer on the first surface based on a vacuum pressure being supplied to the plurality of first suction holes from the vacuum pump; an upper stage having a second surface and including a plurality of second suction holes in the second surface, wherein the upper stage is configured to vacuum suction a second wafer on the second surface based on the vacuum pressure being supplied to the plurality of second suction holes from the vacuum pump; a lower push rod movable through a first center hole in a middle portion of the lower stage to contact and apply pressure to a middle region of the first wafer that overlaps with the first center hole; an upper push rod movable through a second center hole in a middle portion of the upper stage to contact and apply pressure to a middle region of the second wafer that overlaps with the second center hole; a position detection sensor configured to generate wafer position information indicating a bonding propagation position of the first wafer and the second wafer based on detecting at least one of the first wafer or the second wafer through a detection hole in at least one stage of the lower stage or the upper stage; a stage driver configured to cause the lower stage and the upper stage to move in relation to each other; a push rod driver configured to move the lower push rod and the upper push rod in a vertical direction; a wherein the vacuum pump is configured to selectively supply the vacuum pressure to both the first suction holes and the second suction holes; and a processing circuitry communicatively coupled to the stage driver, the push rod driver, and the vacuum pump, the processing circuitry configured to control operations of the stage driver, the push rod driver, and the vacuum pump, the processing circuitry further configured to process the wafer position information to detect the bonding propagation position, the processing circuitry further configured to cause a change, according to the bonding propagation position, of at least one of a ratio of protruding lengths of the lower push rod and the upper push rod, or a ratio of suction areas of the upper stage and the lower stage.

According to some example embodiments, a wafer bonding apparatus may include a lower stage having a first surface and including a plurality of first suction holes in the first surface, wherein the lower stage is configured to vacuum suction a first wafer on the first surface based on a vacuum pressure being supplied to the plurality of first suction holes from the vacuum pump; an upper stage having a second surface and including a plurality of second suction holes in the second surface, wherein the upper stage is configured to vacuum suction a second wafer on the second surface based on the vacuum pressure being supplied to the plurality of second suction holes from the vacuum pump; a lower push rod movable through a first center hole in a middle portion of the lower stage to contact and apply pressure to a middle region of the first wafer that overlaps with the first center hole; an upper push rod movable through a second center hole in a middle portion of the upper stage to contact and apply pressure to a middle region of the second wafer that overlaps with the second center hole; a position detection sensor configured to generate wafer position information indicating a bonding propagation position of the first wafer and the second wafer based on detecting at least one of the first wafer or the second wafer through a detection hole in at least one stage of the lower stage or the upper stage; and a processing circuitry configured to process the wafer position information to detect the bonding propagation position, the processing circuitry further configured to cause a change, according to the bonding propagation position, of at least one of a ratio of protruding lengths of the lower push rod and the upper push rod, or a ratio of suction areas of the upper stage and the lower stage. The detection hole may be positioned within a range between 0.25 R to 0.75 R of a radius (R) from a center of the upper stage to an outer edge of the upper stage or from a center of the lower stage to an outer edge of the lower stage.

According to some example embodiments, while bonding of an upper wafer and a lower wafer propagates radially outwards, a ratio of protruding lengths of a lower push rod and an upper push rod or a ratio of suction areas of a lower stage and an upper stage may be changed. Additionally, a distance between the lower stage and the upper stage may be changed according to a bonding propagation position.

Thus, while the bonding of the upper wafer and the lower wafer propagates, curvatures of the wafers at adhesion points may be controlled to be symmetric to each other to thereby reduce or minimize an alignment error between the wafers, thereby improving the quality of semiconductor devices formed via such bonding, including improving the performance, reliability, and/or efficiency of said semiconductor devices.

BRIEF DESCRIPTION OF THE DRAWINGS

Some example embodiments will be more clearly understood from the following detailed description taken in conjunction with the accompanying drawings. FIGS. 1 to 15 represent non-limiting, some example embodiments as described herein.

FIG. 1 is a block diagram illustrating a wafer to wafer bonding system in accordance with some example embodiments.

FIG. 2 is a cross-sectional view illustrating a wafer bonding apparatus in accordance with some example embodiments.

FIG. 3 is a cross-sectional view illustrating an initial step of a wafer bonding process in the wafer bonding apparatus in FIG. 2.

FIG. 4 is a plan view illustrating an upper stage of the wafer bonding apparatus in FIG. 2.

FIG. 5 is a block diagram illustrating driving portions and a controller of the wafer bonding apparatus in FIG. 2.

FIG. 7 is a graph illustrating a change in the ratio of the protruding lengths of the lower push rod and the upper push rod according to the bonding propagation in accordance with some example embodiments.

FIG. 11 is a graph illustrating a distance between the lower stage and the upper stage at a bonding propagation position.

FIG. 13 is a flowchart illustrating a wafer to wafer bonding method in accordance with some example embodiments.

FIG. 14 is a view illustrating the wafer to wafer bonding method in FIG. 13.

FIG. 15 is a flowchart illustrating a bonding stage of the wafer to wafer bonding method in FIG. 13.

DETAILED DESCRIPTION

Hereinafter, some example embodiments will be explained in detail with reference to the accompanying drawings.

Figure 1:
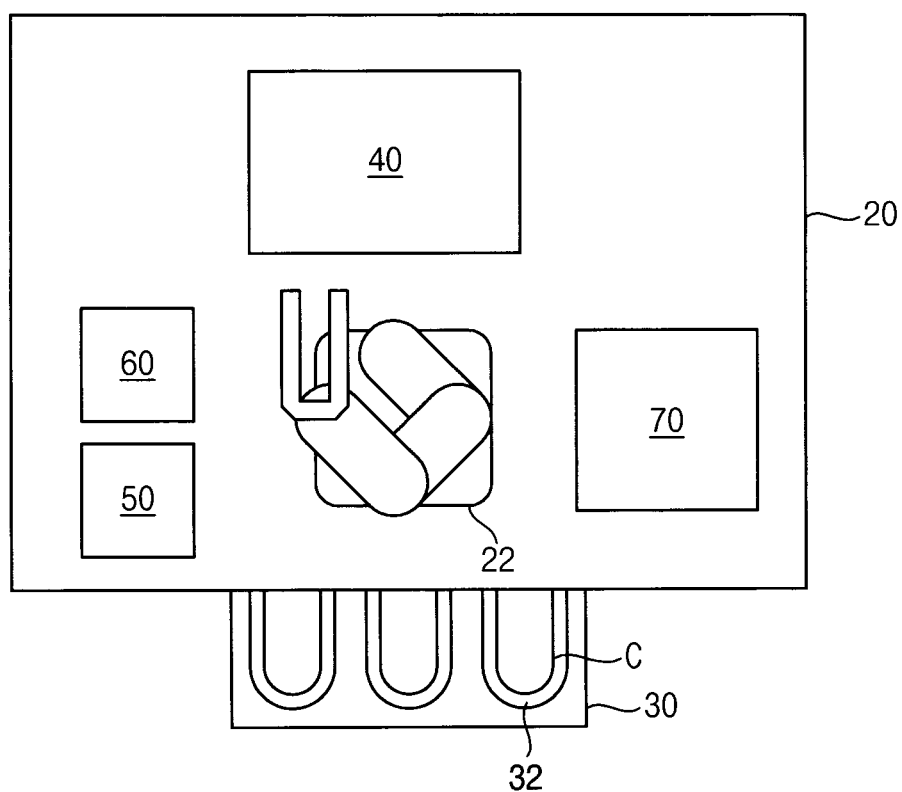

FIG. 1 is a block diagram illustrating a wafer to wafer bonding system according to some example embodiments.

Referring to FIG. 1, a wafer to wafer bonding system 10 may include a pre-treatment apparatus such as a plasma processing apparatus 40 and a cleaning apparatus 50, an aligning apparatus 60, and a wafer bonding apparatus 70 arranged in a clean room 20. The wafer to wafer bonding system 10 may further include a cassette stage 30 disposed in a side of the clean room 20.

In some example embodiments, the clean room 20 may be an enclosed room having a cuboid shape, and may be a controlled environment that has a low level of pollutants such as, for example, dust, airborne microbes, aerosol particles, and chemical vapors.

The cassette stage 30 may provide a space in which wafers are located before being transferred into the clean room 20. A carrier C having a plurality of the wafers received therein may be supported on a support plate 32 of the cassette stage 30. The carrier C may be, for example, a front opening unified pod (FOUP). The wafers received in the carrier C may be transferred into the clean room 20 by a transfer robot 22. For example, three carriers C may be disposed on the cassette stage 30. In some example embodiments, first and second wafers to be bonded to each other may be received in first and second carriers C respectively, and bonded wafers may be received in a third carrier C.

In some example embodiments, the first wafer may be a wafer in which circuits for an image sensor chip are formed, and the second wafer may be a wafer in which photosensors for the image sensor chip are formed, such that the image sensor chip may be formed based on bonding the first and second wafers together to form an image sensor chip that includes the circuits and the photosensors. Alternatively, in some example embodiments, the first wafer may be a wafer in which circuits for a semiconductor package such as a High Band Memory (HBM) are formed, and the second wafer may be a wafer in which memories for the semiconductor package are formed, such that the semiconductor package may be formed based on bonding the first and second wafers together to form a semiconductor package that includes the circuits and the memories.

The plasma processing apparatus 40 may perform a plasma treatment on a surface of the wafer W. The plasma processing apparatus 40 may be an apparatus configured to process plasma on the surface of the wafer W disposed within an ICP (inductively coupled plasma) chamber to form a dangling bond on the surface of the wafer W. However, the plasma generated by the plasma processing apparatus is not limited to inductively coupled plasma utilized in the ICP chamber. For example, some example embodiments may utilize capacitively coupled plasma, microwave plasma, etc., which may be generated by the plasma processing apparatus.

The cleaning apparatus 50 may clean the surface of the wafer that has been plasma-processed by the plasma processing apparatus 40. The cleaning apparatus 50 may coat deionized (DI) water on the wafer surface using a spin coater. The DI water may clean the wafer surface and allow —OH radical to be bonded easily on the wafer surface, such that dangling bonds are easily created on the wafer surface.

The aligning apparatus 60 may detect a flat portion (or notch portion) of the wafer W to align the wafer W. The wafer aligned by the aligning apparatus 60 may be transferred to the plasma processing apparatus 40 or the wafer bonding apparatus 70 by the transfer robot 22.

Hereinafter, the wafer bonding apparatus in FIG. 1 will be explained.

Figure 2:
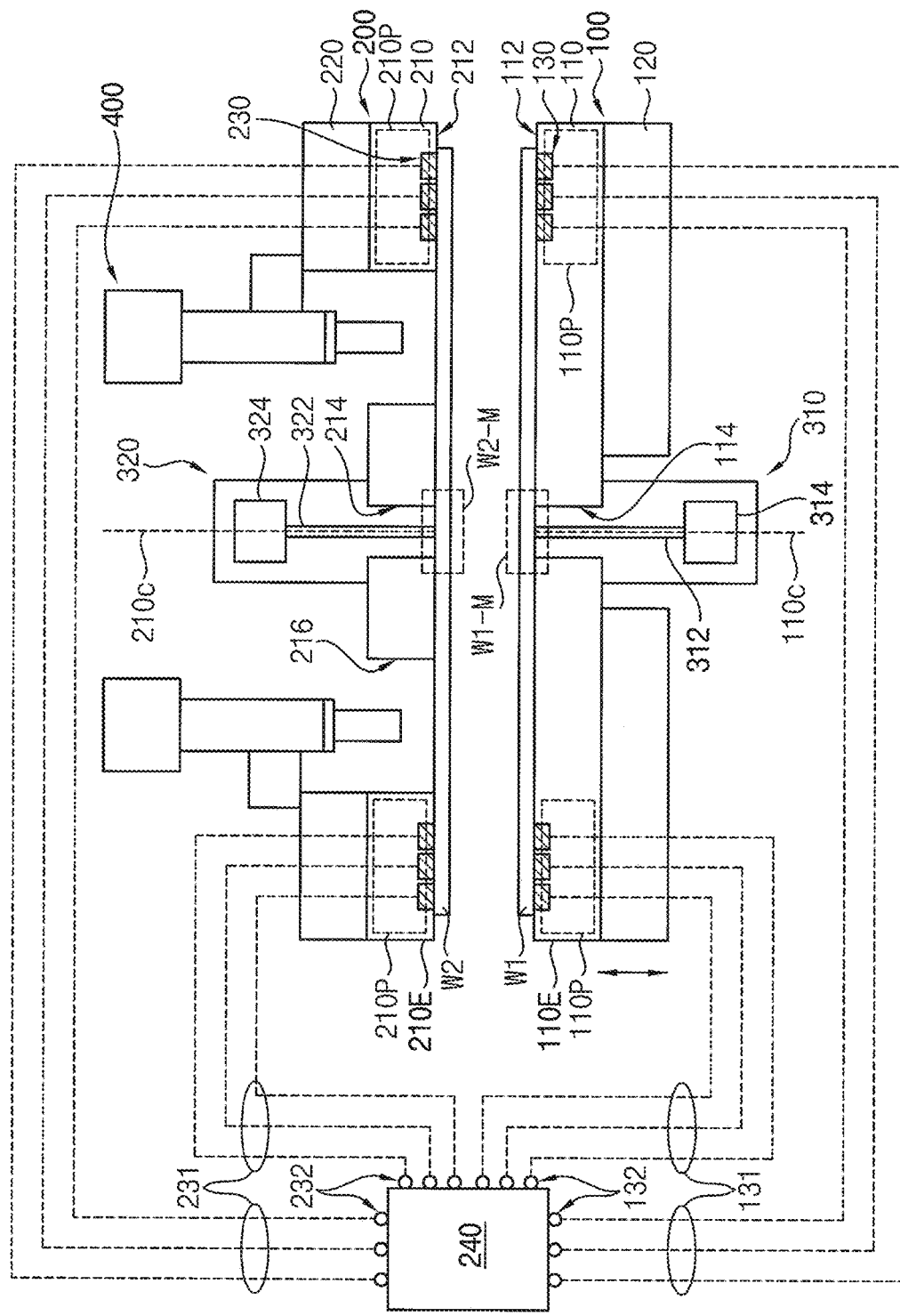
Figure 3:
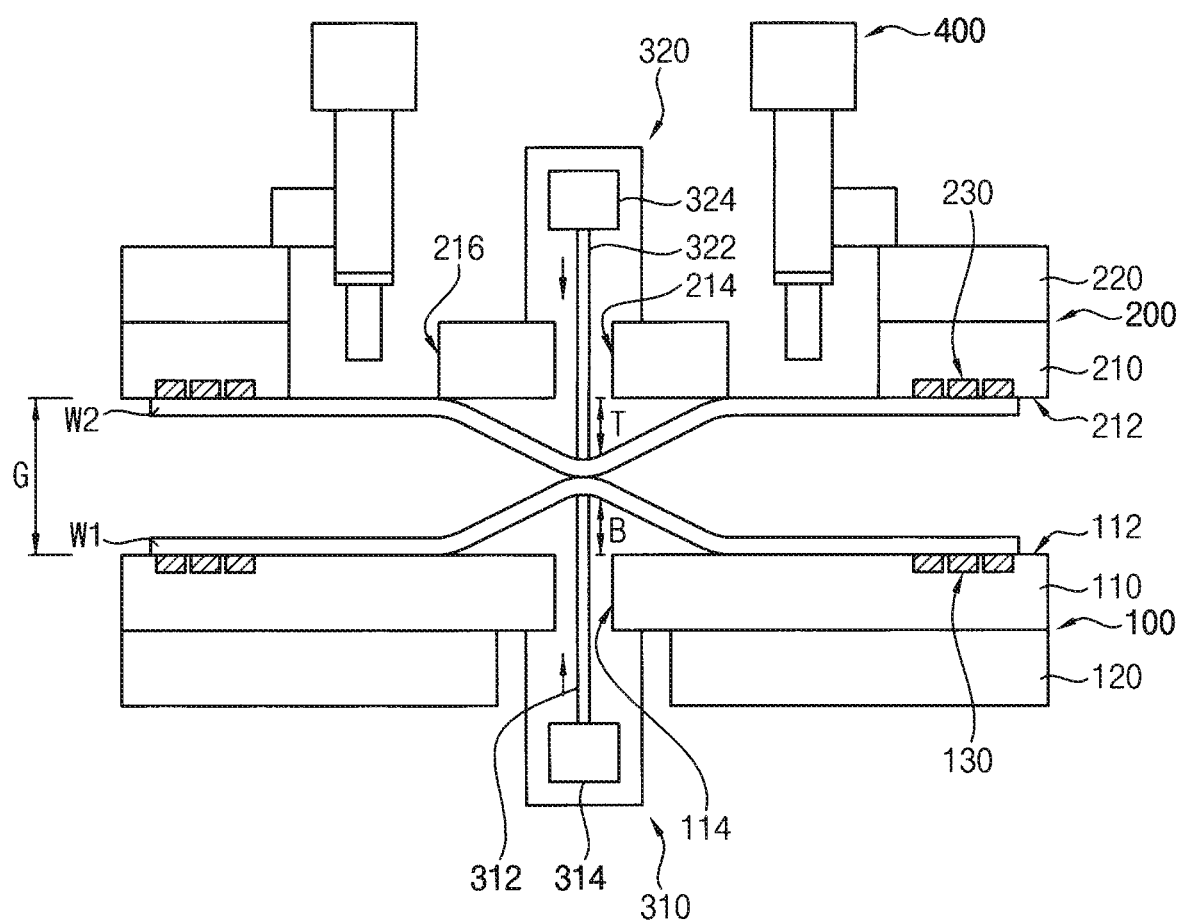
Figure 4:
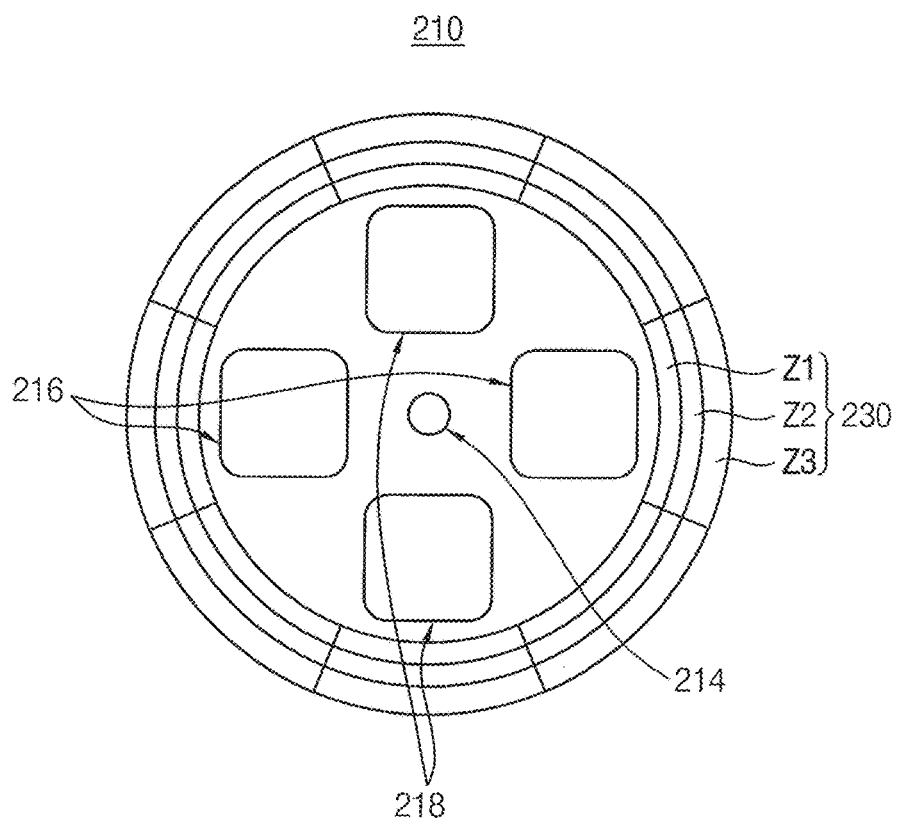
Figure 5:
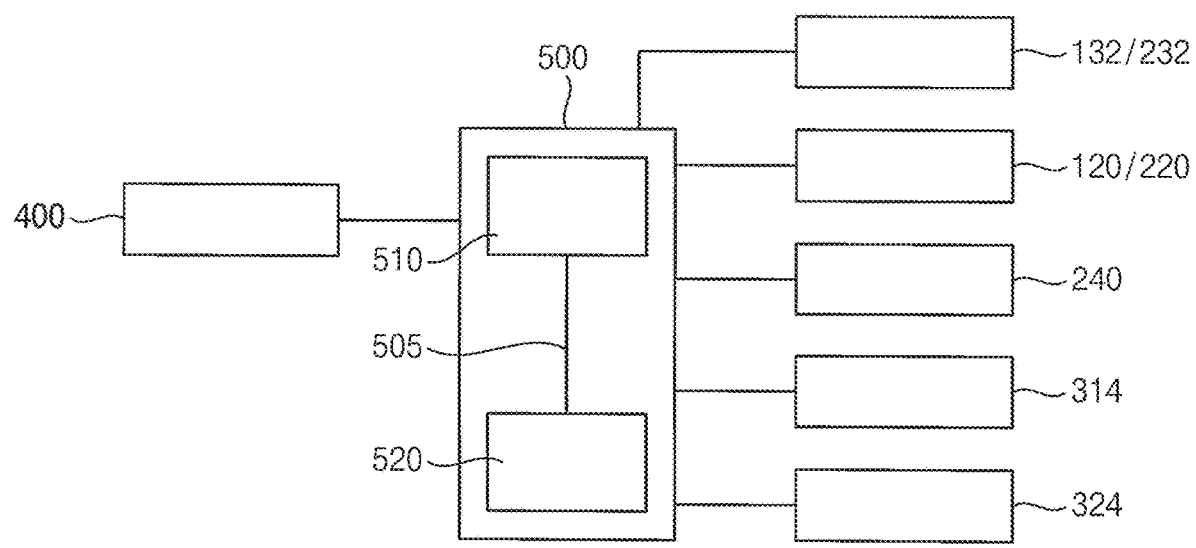

FIG. 2 is a cross-sectional view illustrating a wafer bonding apparatus in accordance with some example embodiments. FIG. 3 is a cross-sectional view illustrating an initial step of a wafer bonding process in the wafer bonding apparatus in FIG. 2. FIG. 4 is a plan view illustrating an upper stage of the wafer bonding apparatus in FIG. 2. FIG. 5 is a block diagram illustrating driving portions and a controller of the wafer bonding apparatus in FIG. 2.

Referring to FIGS. 2 to 5, a wafer bonding apparatus 70 may include a lower chuck structure 100, an upper chuck structure 200, a first wafer push unit 310, a second wafer push unit 320, and a position detection sensor 400. Additionally, the wafer bonding apparatus 70 may further include a plurality of driving portions and a controller 500 configured to control operations of the driving portions. In some example embodiments, the wafer bonding apparatus 70 may omit the driving portions as described herein. Restated, the driving portions may be separate from the wafer bonding apparatus 70.

In some example embodiments, the lower chuck structure 100 may include a lower stage 110 that holds a first wafer W1. The lower stage may be understood to be a structure having surfaces and structures configure to structurally support (e.g., support the weight of), and hold in place, the first wafer W1. The lower stage 110 may have a first surface 112 on which the first wafer W1 is disposed (e.g., on which the first wafer W1 rests). First suction holes 130 may be provided in the first surface 112 of the lower stage 110. Restated, the lower stage 110 may include a plurality of first suction holes 130 that extend through at least the first surface 112, so as to be holes in the first surface 112, where the first suction holes 130 each at least partially define one end of a first suction conduit 131 coupling one or more first suction holes 130 to a vacuum pump (e.g., vacuum pump 240). Accordingly, it will be understood that the plurality of first suction holes 130 may be coupled to a first vacuum pump (e.g., vacuum pump 240) via one or more first suction conduits 131, such that the vacuum pump 240 may supply a vacuum pressure to the first suction holes 130 via the first suction conduits 131 and thus a vacuum force may be applied on at least a portion of an object, such as the first wafer W1, that rests on the first surface 112 so as to at least partially cover one or more first suction holes 130, as shown in FIG. 2. The first wafer W1 may thus be vacuum suctioned by the first suction holes 130 of the lower stage 110, based on a vacuum being applied through the first suction holes 130. Accordingly, it will be understood that the lower stage 110 may vacuum suction the first wafer W1 on the first surface 112 via the first suction holes 130, where a suction force induced through the application of a vacuum to one or more portions of the first wafer W1 that partially or fully cover one or more first suction holes 130 when a vacuum is applied through the first suction holes 130 by a vacuum source.

As shown in FIG. 2, the wafer bonding apparatus 70 may include a set of fluid control valves 132 that may each couple a separate suction conduit 131 to the vacuum pump 240 and may each be adjustable to adjustably control fluid communication between the vacuum pump 240 and a respective one or more suction holes that are coupled to the fluid control valve 132 via at least some portion of the suction conduit 131. It will be understood that, in some example embodiments, a given fluid control valve 132 may couple multiple suction conduits, coupled in parallel with the fluid control valve 132, to the vacuum pump 240, such that the fluid control valve 132 may be configured to control fluid communication between the vacuum pump and the multiple suction conduits 131. The vacuum pump 240 and/or a controller 500 as described herein may independently control the adjustment positions of each of these fluid control valves 132 (e.g., open, closed, partially open, etc.) to independently and selectively control the application of vacuum pressure from the vacuum pump 240 to selected suction conduits 131 and thus selected first suction holes 130. Such control may be based on control signals generated by the controller 500 and communicated to one or more fluid control valves 132 directly or to the vacuum pump 240 to cause the vacuum pump 240 to control the one or more fluid control valves 132 (e.g., in example embodiments where the valves 132 are included in the vacuum pump 240). Accordingly, it will be understood that the controller 500 may be configured to cause vacuum pressure to be selectively and independently applied to selected one or more suction holes of the first suction holes 130.

The upper chuck structure 200 may include an upper stage 210 that holds a second wafer W2. The upper stage 210 may be understood to be a structure having surfaces and structures configure to structurally support (e.g., support the weight of), and hold in place, the second wafer W2. The upper stage 210 may be arranged to face the lower stage 110. The upper stage 210 may have a second surface 212 on which the second wafer W2 is disposed. Second suction holes 230 may be provided in the second surface 212 of the upper stage 210. Restated, the upper stage 210 may include a plurality of second suction holes 230 that extend through at least the second surface 212, so as to be holes in the second surface 212, where the second suction holes 230 each at least partially define one end of a suction conduit 231 (e.g., suction conduit) coupling one or more second suction holes 230 to a vacuum pump (e.g., vacuum pump 240). Accordingly, it will be understood that the plurality of second suction holes 230 may be coupled to a second vacuum pump, which may be the same or different as the first vacuum pump (e.g., vacuum pump 240) via one or more second suction conduits 231, such that a vacuum pressure may be supplied to the second suction holes 230 via the second suction conduits 231 and thus a vacuum force may be applied on at least a portion of an object, such as the second wafer W2, that is in contact with the second surface 212 so as to at least partially cover one or more second suction holes 230, as shown in FIG. 2. It will be understood that the vacuum pump 240 may supply the same vacuum pressure to both the first and second suction holes 130 and 230. The second wafer W2 may thus be vacuum suctioned by the second suction holes 230 of the upper stage 210, based on a vacuum being applied through the second suction holes 230, where the vacuum force induced on second wafer W2 is at least sufficient to overcome the weight of the second wafer W2 and hold the second wafer W2 in place against the second surface 212. Accordingly, it will be understood that the upper stage 210 may vacuum suction the second wafer W2 on the second surface 212 via the second suction holes 230, where a suction force induced through the application of a vacuum to one or more portions of the second wafer W2 that partially or fully cover one or more second suction holes 230 when a vacuum is applied through the second suction holes 230 by a vacuum source.

As shown in FIG. 2, the wafer bonding apparatus 70 may include a set of fluid control valves 232 that may each couple a separate suction conduit 231 to the vacuum pump 240 and may each be adjustable to adjustably control fluid communication between the vacuum pump 240 and a respective one or more suction holes that are coupled to the fluid control valve 232 via at least some portion of the suction conduit 231. It will be understood that, in some example embodiments, a given fluid control valve 232 may couple multiple suction conduits, coupled in parallel with the fluid control valve 232, to the vacuum pump 240, such that the fluid control valve 232 may be configured to control fluid communication between the vacuum pump and the multiple suction conduits 231. The vacuum pump 240 and/or a controller 500 as described herein may independently control the adjustment positions of each of these fluid control valves 232 (e.g., open, closed, partially open, etc.) to independently and selectively control the application of vacuum pressure from the vacuum pump 240 to selected suction conduits 231 and thus selected second suction holes 230. Such control may be based on control signals generated by the controller 500 and communicated to one or more fluid control valves 232 directly or to the vacuum pump 240 to cause the vacuum pump 240 to control the one or more fluid control valves 232 (e.g., in example embodiments where the valves 232 are included in the vacuum pump 240). Accordingly, it will be understood that the controller 500 may be configured to cause vacuum pressure to be selectively and independently applied to selected one or more suction holes of the second suction holes 230.

The first suction holes 130 of the lower stage 110 and the second suction holes 230 of the upper stage 210 may be arranged to correspond to each other. That is, the first suction holes 130 and the second suction holes 230 may be arranged mirror-symmetrically to each other.

As illustrated in FIG. 4, the second suction holes 230 may be arranged in a peripheral region 210P of the upper stage 210 to provide (e.g., define) an outer suction region. The second suction holes 230 may suction a peripheral portion of the second wafer W2. Although it is not illustrated in the figures, inner suction holes may be additionally formed in a middle region of the upper stage 210 to provide an inner suction region. Because the first suction holes 130 correspond to the second suction holes 230, a detailed explanation concerning the first suction holes 130 will be omitted.

The second suction holes 230 may have a first suction portion Z1, a second suction portion Z2 and a third suction portion Z3 arranged sequentially in a radial direction from a center. For example, each of the first to third suction portions Z1, Z2, Z3 may include eight segments of an arch shape to have an entirely annual form. In some example embodiments, each of the first to third suction portions has eight arch-shaped segments, however, it may not be limited thereto, for example, the suction portion may have 8 to 64 arch-shaped segments such as 16, 32, 64, etc.

The second suction holes 230 (suction region II) may be positioned in the peripheral region 210P of the upper stage 210 (e.g., arranged and/or extending annularly around a center 210C of the upper stage 210 as shown in at least FIGS. 2-4), for example, at least 0.6 R (e.g., 60%) of a radius (R) from the center (210C) of the upper stage 210 to the outer edge (210E) of the upper stage 210, preferably, 0.8 R or more (e.g., at least 0.8 R). Similarly, the first suction holes 130 (suction region I) may be positioned in the peripheral region 110P of the lower stage 110 (e.g., arranged and/or extending annularly around a center 110C of the lower stage 110 as shown in at least FIGS. 2-4), for example, at least 0.6 R (e.g., 60%) of a radius (R) from the center (110C) of the lower stage 110 to the outer edge (110E) of the lower stage 110, preferably, 0.8 R or more (e.g., at least 0.8 R). In case that the wafer has a diameter of 300 mm, the first suction portion Z1 may have an inner radius of about 133 mm and an outer radius of about 136 mm from the center of the upper stage 210, the second suction portion Z2 may have an inner radius of about 139 mm and an outer radius of about 142 mm from the center of the upper stage 210, and the third suction portion Z3 may have an inner radius of about 145 mm and an outer radius of about 148 mm from the center of the upper stage 210. A width in the radial direction of each of the first to third suction portions Z1, Z2, Z3 may be about 3 mm, however, it may not be limited thereto, for example, the width in the radial direction may range from about 1 mm to about 5 mm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Each of the first to third suction portions Z1, Z2, Z3 having the annular shape may include a plurality of recesses having an arch shape. For example, each of the first to third suction portions Z1, Z2, Z3 may have eight recesses of an arch shape. One recess may have a central angle of about 45 degrees. It may be understood that the numbers and shapes of the suction portions and the recesses may not be limited thereto.

The first to third suction portions Z1, Z2, Z3 may be connected to a vacuum pump 240 through one or more pipe lines (e.g., one or more second suction conduits 231) respectively. For example, vacuum pressure may be supplied (e.g., applied, induced, etc.) independently or by group (for example, arch-shaped recesses opposite to each other) to eight arch-shaped segments of the first suction portion Z1.

The vacuum pump 240 may be connected to and controlled by a controller 500 to supply the vacuum pressure to the first to third suction portions Z1, Z2, Z3. Additionally, the vacuum pump 240 may supply (e.g., apply, induce, etc.) the vacuum pressure to each of the segments of the first to third suction portions Z1, Z2, Z3. It will be understood that the vacuum pump 240 may include a set of valves 132, 232 that may be separately controlled, based on control signals provided to the vacuum pump 240 from the controller 500, to selectively control the supplying of vacuum pressure to separate, respective suction conduits (e.g., suction conduits 131, 231) to control the selective supplying of vacuum pressure to various suction portions defined by the first suction holes 130 and/or second suction holes 230.

For example, when the vacuum pressure is supplied to the first to third suction portions Z1, Z2, Z3 (Z1, Z2, Z3: ON), a first vacuum region of a first suction area (also referred to herein as simply a "first suction area") may be formed in the peripheral region of the upper stage 210. When the vacuum pressure is supplied to the second and third suction portions Z2, Z3 (Z2, Z3: ON), a second vacuum region of a second suction area (also referred to herein as simply a "second suction area") less than the first suction area may be formed in the peripheral region of the upper stage 210. When the vacuum pressure is supplied to the third suction portions Z3 (Z3: ON), a third vacuum region of a third suction area (also referred to herein as simply a "third suction area") less than the second suction area may be formed on the peripheral region of the upper stage 210.

In FIGS. 2 and 3, the first to third suction portions Z1, Z2, Z3 of the upper stage 210 may be illustrated by hatching (Z1, Z2, Z3: ON) and first to third suction portions Z1, Z2, Z3 of the lower stage 110 may be illustrated by hatching (Z1, Z2, Z3: ON).

As described later, a ratio of the suction areas of the upper stage 210 and the lower stage 110 may be controlled to change (e.g., based on control signals generated by the controller 500 and transmitted to one or more elements of the wafer bonding apparatus 70) according to bonding propagation. The suction area (suction region II) formed in the upper stage 210 may be controlled to be asymmetric to the suction area (suction region I) formed in the lower stage 110. For example, at a first time point of the bonding propagation, the suction area of the first suction area may be provided in the upper stage 210 and the suction area of the third suction area may be provided in the lower stage 110.

The holding of the first and second wafers W1, W2 may be implemented by various ways. For example, as described above, the first and second wafers W1, W2 may be vacuum suctioned by the first and second suction holes 130, 230 respectively. Alternatively, the first and second wafers W1, W2 may be suctioned using electrostatic force such as an electrostatic chuck. In this case, the ratio of the suction areas of the upper stage 210 and the lower stage 110 may be controlled to change according to the bonding propagation.

In some example embodiments, the lower chuck structure 100 may include a lower stage driving portion 120 (also referred to herein as a lower stage driver) which is configured to move the lower stage 110. The lower stage driving portion 120 may include a horizontal driving portion to move translationally the lower stage 110 in X, Y, Z directions and a rotational driving portion to rotate the lower stage 110 about Z axis.

The lower stage 110 may be installed to be movable translationally and rotationally by the lower stage driving portion 120 such that a relative position between the upper stage 210 and the lower stage 110 may be adjusted. As described later, the lower stage 110 may be movable upwardly and downwardly in Z direction by the lower stage driving portion 120. Accordingly, the lower stage 110 may move the first wafer W1 suctioned thereon toward the second wafer W2 suctioned on the upper stage 210.

The upper chuck structure 200 may include an upper stage driving portion 220 (also referred to herein as an upper stage driver) which is configured to move the upper stage 210. The upper stage driving portion 220 may perform similar functions as the lower stage driving portion 120. In some example embodiments, the wafer bonding apparatus 70 may include one or both of the lower stage driving portion 120 and the upper stage driving portion 220. Each driving portion of the lower stage driving portion 120 and the upper stage driving portion 220 may be separately understood to be a stage driver configured to cause one or both of the lower stage 110 and the upper stage 210 to move in relation to each other. In some example embodiments, the lower stage driving portion 120 and/or the upper stage driving portion 220 may be collectively referred to as a single stage driver; such a stage driver may be configured to move both the lower stage 110 and the upper stage 210, separately or in concert with each other. In some example embodiments, the lower stage driving portion 120 and/or the upper stage driving portion 220 may include a piston actuator.

In some example embodiments, the first wafer push unit 310 may include a lower push rod 312 and a lower push rod driving portion 314 (also referred to as a lower push rod driver). The second wafer push unit 320 may include an upper push rod 322 and an upper push rod driving portion 324 (also referred to herein as an upper push rod driver). The lower push rod driving portion 314 and/or the upper push rod driving portion 324 may each be a piston actuator. The lower push rod driving portion 314 and/or the upper push rod driving portion 324 may collectively be referred to as a push rod driver that is configured to cause the lower push rod 312 and the upper push rod 322 to move in the vertical direction (e.g., move in the Z-direction, which extends in parallel to the longitudinal axes of the lower push rod 312 and the upper push rod 322).

The lower push rod driving portion 314 may be connected to and controlled by the controller 500 and may move the lower push rod 312 upwardly and downwardly. Restated, the lower push rod driving portion 314 may be configured to move the lower push rod according to a control signal generated by the controller 500. The lower push rod 312 may be installed to be movable (e.g., in a direction extending parallel with the longitudinal axis of the lower push rod 312) through a center hole 114 (also referred to herein as a first center hole) formed in (e.g., extending through) the middle portion of the lower stage 110 (e.g., a central portion of the lower stage 110 that encompasses a center of the first surface 112). As shown, the center hole 114 may extend through the first surface 112, such that at least a portion of the first wafer W1 on the first surface 112 covers the center hole 114. The lower push rod 312 may move upwardly by the lower push rod driving portion 314 to pressurize (e.g., contact and apply pressure to) a middle region W1-M of the first wafer W1, where the middle region W1-M may be a central portion of the first wafer W1 that is vertically aligned with (e.g., overlaps, covers, etc.) the center hole 114. The lower push rod driving portion 314 may include a driving source such as a hydraulic cylinder, a pneumatic cylinder, a linear motor, a solenoid device, etc.

The upper push rod driving portion 324 (also referred to as an upper push rod driver) may be connected to and controlled by the controller 500 and may move the upper push rod 322 upwardly and downwardly. Restated, the upper push rod driving portion 324 may be configured to move the upper push rod 322 according to a separate control signal (separate from the control signal according to which the lower push rod driving portion 314 moves the lower push rod 312) generated by the controller 500. The upper push rod 322 may be installed to be movable (e.g., in a direction extending parallel with the longitudinal axis of the upper push rod 322) through a center hole 214 (also referred to herein as a second center hole) formed in (e.g., extending through) the middle portion of the upper stage 210 (e.g., a central portion of the upper stage 210 that encompasses a center of the second surface 212). As shown, the center hole 214 may extend through the second surface 212, such that at least a portion of the second wafer W2 on the second surface 212 (e.g., held in contact with the second surface 212) covers the center hole 214. The upper push rod 322 may move downwardly by the upper push rod driving portion 324 to pressurize (e.g., contact and apply pressure to) a middle region W2-M of the second wafer W2, where the middle region W2-M may be a central portion of the second wafer W2 that is vertically aligned with (e.g., overlaps, covers, etc.) the center hole 214. Each of the upper push rod driving portion 324 and the lower push rod driving portion 314 may include a driving source (e.g., driver) such as a hydraulic cylinder, a pneumatic cylinder, a linear motor, a solenoid device, etc.

For example, the controller 500 may control a protruding length B of the lower push rod 312 from the lower stage 110 and a protruding length T of the upper push rod 322 from the upper stage 210. As described later, a ratio of the protruding lengths of the lower push rod 312 and the upper push rod 322 may be controlled by the controller 500 to change according to the bonding propagation.

In some example embodiments, the position detection sensor 400 may be provided in at least one of the lower chuck structure 100 or the upper chuck structure 200. The position detection sensor 400 may be configured to detect a bonding propagation position of the first wafer W1 and the second wafer W2. Restated, the position detection sensor 400 may generate wafer position information indicating a position of one or more portions of the first wafer W1 and/or the second wafer W2 based on detecting the first wafer W1 and/or second wafer W2 (e.g., capturing images of the first wafer W1 and/or second wafer W2, detecting reflected light from an exposed portion of the first wafer W1 and/or the second wafer W2 and determining a time of flight of the reflected light, etc.) through one or more detection holes 216. The wafer position information may be processed (e.g., at the controller 500) to determine (e.g., detect) a bonding propagation position of the first wafer W1 and the second wafer W2. In some example embodiments, the position detection sensor 400 is configured to process sensor data generated at the position detection sensor 400 to determine the bonding propagation position of the first wafer W1 and the second wafer W2 and provide information indicating the bonding propagation position to the controller 500. It will be understood that the wafer position information generated by the position detection sensor 400 may be generated based on a detection of at least one of the first wafer W1 or the second wafer W2 by the position detection sensor 400, where such detection of the first wafer W1 and/or the second wafer W2 may include capturing an image of an exposed portion of the first wafer W1 and/or the second wafer W2 through a detection hole 216, where such image may be processed to determine a position (e.g., distance) of the exposed portion from the position detection sensor 400. Such detection may include emitting a light beam from the position detection sensor 400 to the at least one of the first wafer W1 or the second wafer W2, detecting a reflection of at least a portion of the emitted light that is reflected by the at least one of the first wafer W1 or the second wafer W2 back to the position detection sensor 400, and determining a portion of the exposed portion based on a determined time of flight of the light from the position detection sensor 400 to the exposed portion and back to the position detection sensor 400 via reflection. The position detection sensor 400 may include at least one vision camera that is configured to capture one or more images of the first wafer W1 and/or the second wafer W2, where such images may be processed to determine a bonding propagation position of the first wafer W1 and/or the second wafer W2. Two vision cameras may be provided in the upper chuck structure 200.

In particular, as shown in at least FIG. 2, the position detection sensor 400 may be a vision camera that may capture an image of the second wafer W2 through a detection hole 216 formed in the upper stage 210 to detect (e.g., generate sensor data, such as the image, that may be processed to detect) a deformation of the second wafer using a shading ratio. As shown in FIG. 2, the detection hole 216 may extend through at least a portion of the upper stage 210 to extend through the second surface 212 and thus expose at least a portion of the second wafer W2. The detection hole 216 may be formed to be spaced apart from the center of the upper stage 210 by a particular (or, alternatively, predetermined) distance. For example, the detection hole 216 may be positioned within a range between 0.25 R to 0.75 R of the radius (R) from the center (210C) of the upper stage 210 to an outer edge (210E) of the upper stage 210 or from the center (110C) of the lower stage 110 to an outer edge (110E) of the lower stage 110. In case that the wafer has a diameter of 300 mm, the detection hole 216 may have an inner radius of about 37.5 mm and an outer radius of about 112.5 mm from the center of the upper stage 210. Accordingly, the bonding propagation position in the range between 37.5 mm and 112.5 mm from the center of the upper stage 210 may be detected using the vision camera. The detection hole 216 may be positioned inwardly from the second suction hole 230 (suction region) (e.g., between one or more second suction holes 230 and the center hole 214).

The position detection sensor 400 (e.g., vision camera) may generate wafer position information, based on detecting at least an exposed portion of the first wafer W1 and/or second wafer W2 through a detection hole 216, that may be used to detect the bonding propagation position of the second wafer W2 through the detection hole 216. The position detection sensor 400 may generate detected wafer position information based on the sensor data, where the detected wafer position information may indicate a position of the second wafer W2. The position detection sensor 400 (e.g., vision camera) may output (e.g., transmit) the detected wafer position information (e.g., information indicating the detected bonding propagation position) to the controller 500, and the controller 500 may calculate the bonding propagation position of one or both of the first and second wafers W1, W2 based on the inputted wafer position information. It will be understood that the controller 500 may calculate a bonding propagation position of a wafer (e.g., first wafer W1) that is not directly imaged by the position detection sensor 400.

Accordingly, it will be understood that the position detection sensor 400 may generate wafer position information that may indicate a bonding propagation position of the first wafer W1 and/or the second wafer W2 based on directly monitoring the first wafer W1 and/or the second wafer W2 through a detection hole 216, where the bonding propagation position may be of a wafer that is not directly monitored by the position detection sensor 400 through the detection hole 216. While the detection hole 216 in FIG. 2 is shown to be a detection hole that extends through the upper stage 210, it will be understood that, in some example embodiments, a wafer bonding apparatus 70 may include one or more detection holes 216 that extend through the lower stage 110 and thus through the first surface 112, in addition or in alternative to including one or more detection holes 216 that extend through the upper stage 210 as shown in FIG. 2, and furthermore the wafer bonding apparatus 70 may include one or more position detection sensors 400 that are below the first surface 112 and are configured to detect a bonding propagation position of the first wafer W1 and/or the second wafer W2 through a detection hole 216 extending through the lower stage 110, in addition or in alternative to the position detection sensors 400 shown in FIG. 2.

As illustrated in FIG. 5, the controller 500 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a processor 510 that may include central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry of controller 500 may include a non-transitory computer readable storage device 520 (e.g., memory), for example a solid state drive (SSD), storing a program of instructions, and a processor 510 coupled to the storage device 520 (e.g., via a bus 505) and configured to execute the program of instructions to implement the functionality of the controller 500. Accordingly, a controller 500 as described herein may be interchangeably referred to as "processing circuitry" that may be configured to implement any and all functionality of the controller 500 as described herein.

As illustrated in FIG. 5, the controller 500 may be connected (e.g., communicatively coupled) to elements of the wafer bonding apparatus 70 (e.g., the upper and lower stage driving portions 120, 220, the fluid control valves 132, 232, the upper and lower push rod driving portions 314, 324, and the vacuum pump 240) and is configured to control operations thereof. The controller 500 may receive the position information from the position detection sensor 400 and determine (e.g., calculate) the bonding propagation position of the first and second wafers W1, W2 based on the position information. The controller 500 may apply (e.g., generate, transmit, etc.) control signals to the driving portions such as the lower stage driving portion 120, the vacuum pump 240, the lower push rod driving portion 314 and the upper push rod driving portion 324 to control the operation of the wafer bonding apparatus 70.

In some example embodiments, the wafer bonding apparatus 70 may further include a position detector (not illustrated) for aligning the wafers. The position detector may detect an alignment key such as an align key for the first wafer W1 and the second wafer W2 through a hole 218 formed in the upper stage 210 and a hole formed in the lower stage 110, and the controller 500 may align the first and second wafers W1, W2 based on the detected information.

Hereinafter, a wafer bonding method performed using the wafer bonding apparatus in FIG. 2 will be explained.

Figure 6A:
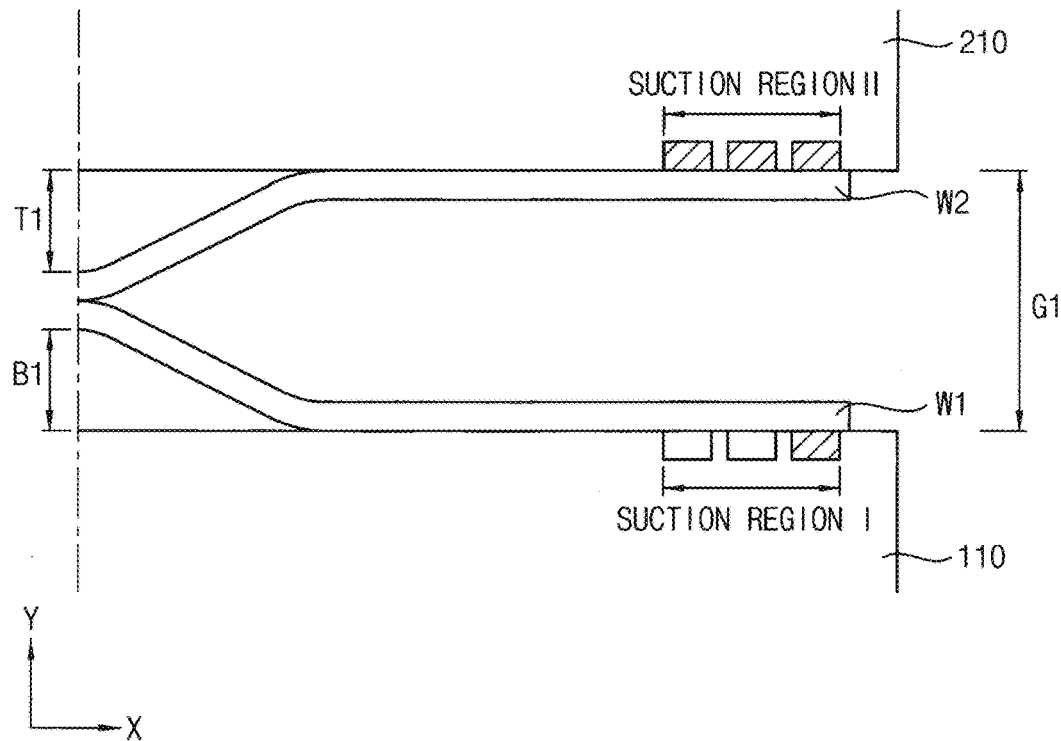
FIGS. 6A and 6B are cross-sectional views illustrating stages of a bonding process of first and second wafers in a wafer bonding apparatus in some example embodiments.
Figure 6B:
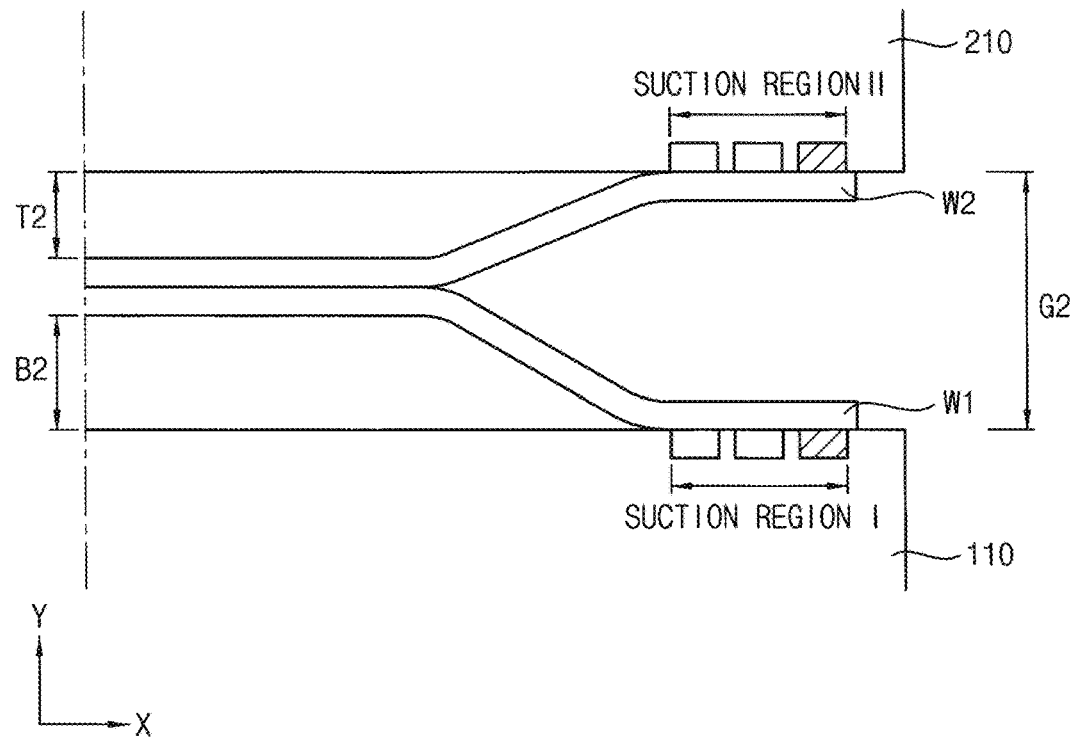

FIGS. 6A and 6B are cross-sectional views illustrating stages of a bonding process of first and second wafers in a wafer bonding apparatus in some example embodiments.

Referring to FIG. 6A, in order to progress a wafer bonding process, first and second wafers W1, W2 may be held on the lower stage 110 and the upper stage 210.

First, the first wafer W1 may be vacuum suctioned to be held on the first surface 112 of the lower stage 110. The second wafer W2 may be vacuum suctioned to be held on the second surface 212 of the second wafer W2.

Then, the lower push rod 312 may ascend toward the upper stage 210 to pressurize the middle portion of the first wafer W1. Thus, the middle portion of the first wafer W1 may be detached from the first surface 112 of the lower stage 110 to protrude upward more than the peripheral region. At the same time, the upper push rod 322 may descent toward the lower stage 110 to pressurize the middle portion of the second wafer W2. Thus, the middle portion of the second wafer W2 may be detached from the second surface 212 of the upper stage 210 to protrude downward more than the peripheral region.

When the first wafer W1 bends upward such that it is upwardly concave and the second wafer W2 bends downward such that it is downwardly concave, the lower stage 110 may travel upward such that the first wafer W1 contacts the second wafer W2. If the middle portion of the first wafer W1 initially contacts the middle portion of the second wafer W2, the bonding is started.

At the initial time of the bonding, the lower push rod 312 may have a first protruding length B1 from the lower stage 110 and the upper push rod 322 may have a first protruding length T1.

Additionally, at the bonding initial time, the controller 500 may control the vacuum pump 240 to cause vacuum pressure to be applied (e.g., supplied) to the first to third suction portions Z1, Z2, Z3 of the upper stage 210 (Z1, Z2, Z3: ON) to form a suction region of a first suction area in the peripheral region of the upper stage 210, and the controller 500 may control the vacuum pump 240 to cause vacuum pressure to be applied to the third suction portion Z3 of the lower stage 110 (Z3: ON) to form a suction region of a third suction area less than the first suction area in the peripheral region of the lower stage 110. Accordingly, at the bonding initial time, a first suction area is formed in a peripheral region of the upper stage 210 and a second suction area having an area that is less than the first suction area is formed in a peripheral region of the lower stage 110, where the first suction area is understood to be a total area of second suction holes 230 to which vacuum pressure is actively being supplied from the vacuum pump 240 and the second suction area is understood to be a total area of first suction holes 130 to which the vacuum pressure is actively being supplied from the vacuum pump 240, based on causing vacuum pressure to be supplied to a greater quantity of second suction holes 230 than first suction holes 130. It will be understood that, in some example embodiments, the controlling of application of vacuum pressure to certain suction portions of the upper stage 210 and/or lower stage 110 may include controlling valve positions of one or more valves coupled to the vacuum pump 240 in order to control which suction conduits 131, 231 the vacuum pressure is supplied to. In FIG. 6A, the first to third suction portions Z1, Z2, Z3 of the upper stage 210 may be illustrated by hatching and the third suction portion Z3 of the lower stage 110 may be illustrated by hatching.

Referring to FIG. 6B, the bonding of the first wafer W1 and the second wafer W2 may propagate radially outwards and then the first and second wafers may be joined. The bonding propagation position may be detected by the position detection sensor 400. The bonding propagation position at the peripheral region of the first wafer W1 and the second wafer W2 may be detected by the position detection sensor 400. For example, in case that the wafer has a diameter of 300 mm, the bonding propagation position may be detected at a range between about 37.5 mm to about 110 mm of a radius of the first and second wafers W1, W2.

The ratio of the protruding lengths (B/T) of the lower push rod 312 and the upper push rod 322 may be controlled to change according to the bonding propagation. The ratio of the suction areas of the upper stage 210 and the lower stage 110 may be controlled to change according to bonding propagation. Restated, the controller 500 may be configured to cause a change (e.g., based on transmitting control signals to the lower push rod driving portion 314 and/or the upper push rod driving portion 324), according to a determined bonding propagation position of at least one of the first wafer W1 or the second wafer W2, of at least one of the ratio of the protruding lengths (B/T) of the lower push rod 312 and the upper push rod 322 or the ratio of the suction areas of the upper stage 210 and the lower stage 110. A distance (G) between the lower stage 110 and the upper stage 210 may be controlled to change according to the bonding propagation. Restated, the controller 500 may be configured to cause a change (e.g., based on transmitting control signals to the lower stage driving portion 120 and/or the upper stage driving portion 220) of a distance (G) between the lower stage 110 and the upper stage 210 according to the determined bonding propagation position.

At the propagation of the bonding, the lower push rod 312 may have a second protruding length B2 from the lower stage 110 and the upper push rod 322 may have a second protruding length T2.

Additionally, at the bonding propagation time, vacuum pressure may be applied to the third suction portions Z3 of the upper stage 210 and the lower stage 110 (Z3: ON) to form a suction region of the third suction area in each of the peripheral regions of the upper stage 210 and the lower stage 110. Accordingly, at the bonding propagation time, a third suction area is formed in a peripheral region of the upper stage 210, where the third suction area has an area that is equal to or less than the second suction area, and a fourth suction area is formed in the peripheral region of the lower stage 110, where the fourth suction area has an area that is equal than the second suction area, where the third suction area is understood to be a total area of second suction holes 230 to which vacuum pressure is actively being supplied from the vacuum pump 240 and the fourth suction area is understood to be a total area of first suction holes 130 to which the vacuum pressure is actively being supplied from the vacuum pump 240. It will be understood that, in some example embodiments, the controlling of application of vacuum pressure to certain suction portions of the upper stage 210 and/or lower stage 110 may include controlling valve positions of one or more valves coupled to the vacuum pump 240 in order to control which suction conduits 131, 231 the vacuum pressure is supplied to. In FIG. 6B, the third suction portions Z3 of the upper stage 210 and the lower stage 110 may be illustrated by hatching.

Hereinafter, a control method for compensating asymmetry of the first and second wafers according to the wafer bonding propagation will be explained.

Figure 7:
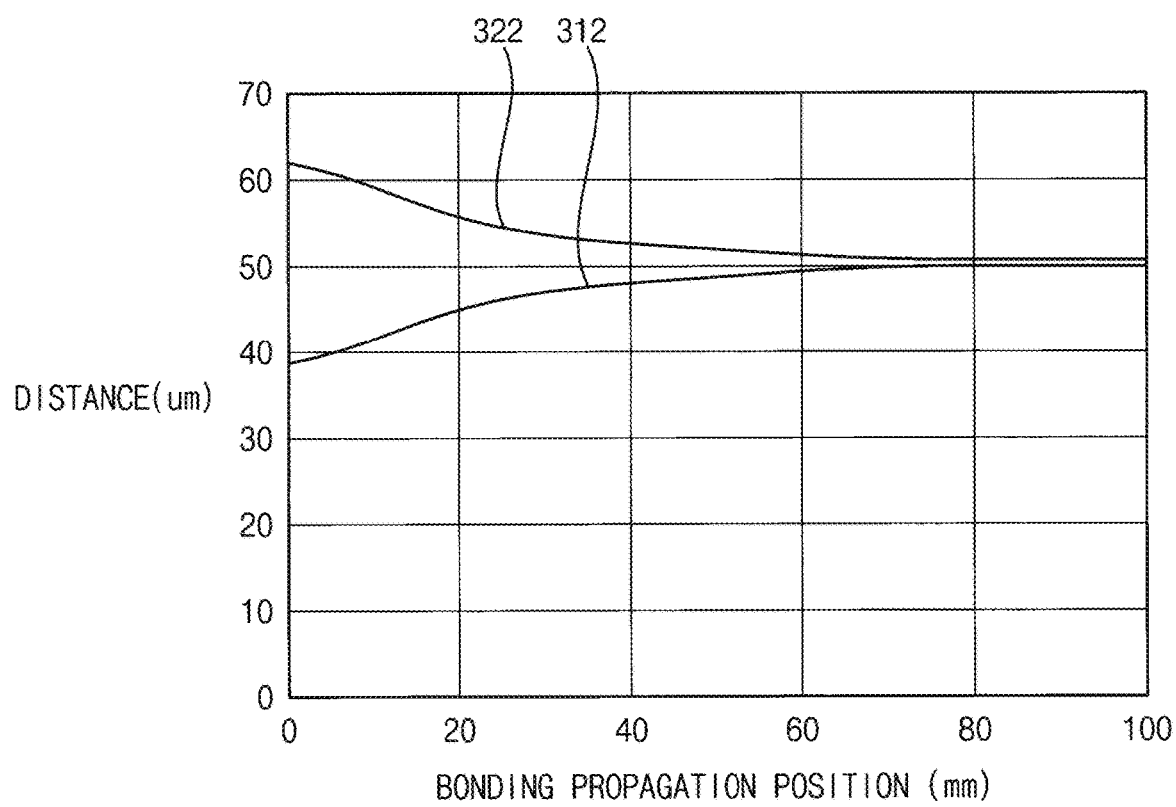
Figure 8A:
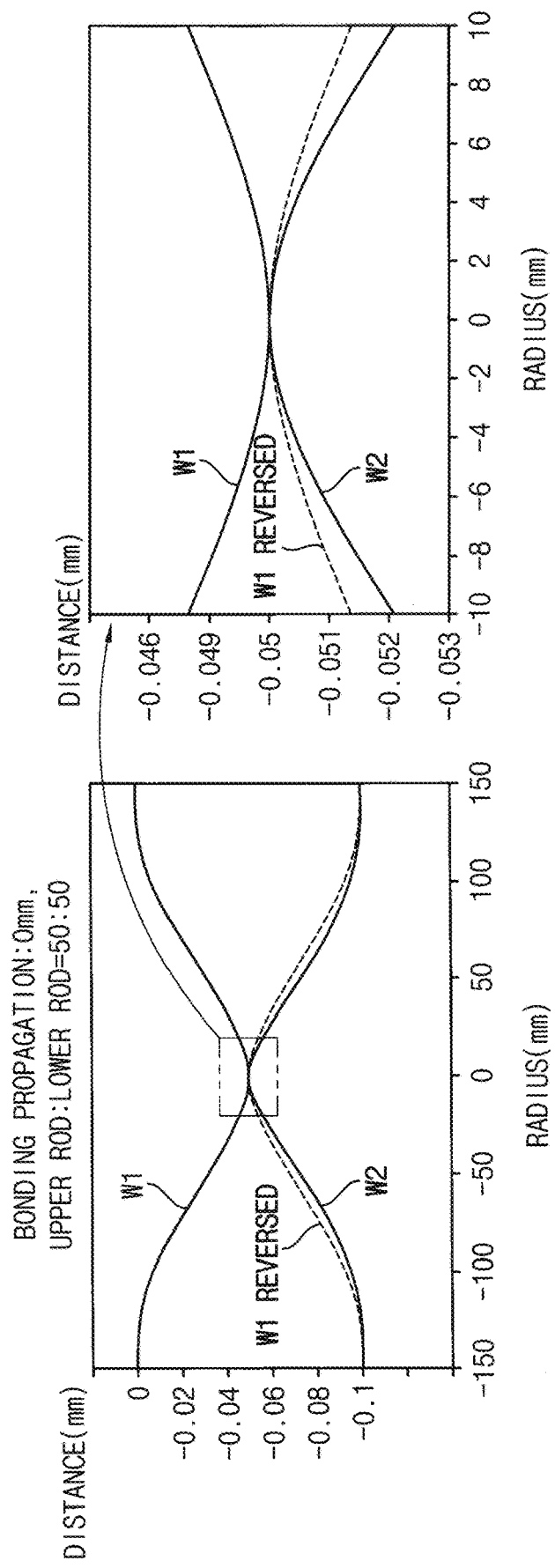
FIGS. 8A and 8B are graphs illustrating curvatures of the first and second wafers according to the ratio of the protruding lengths of the lower push rod and the upper push rod at the bonding initial time.
Figure 8B:
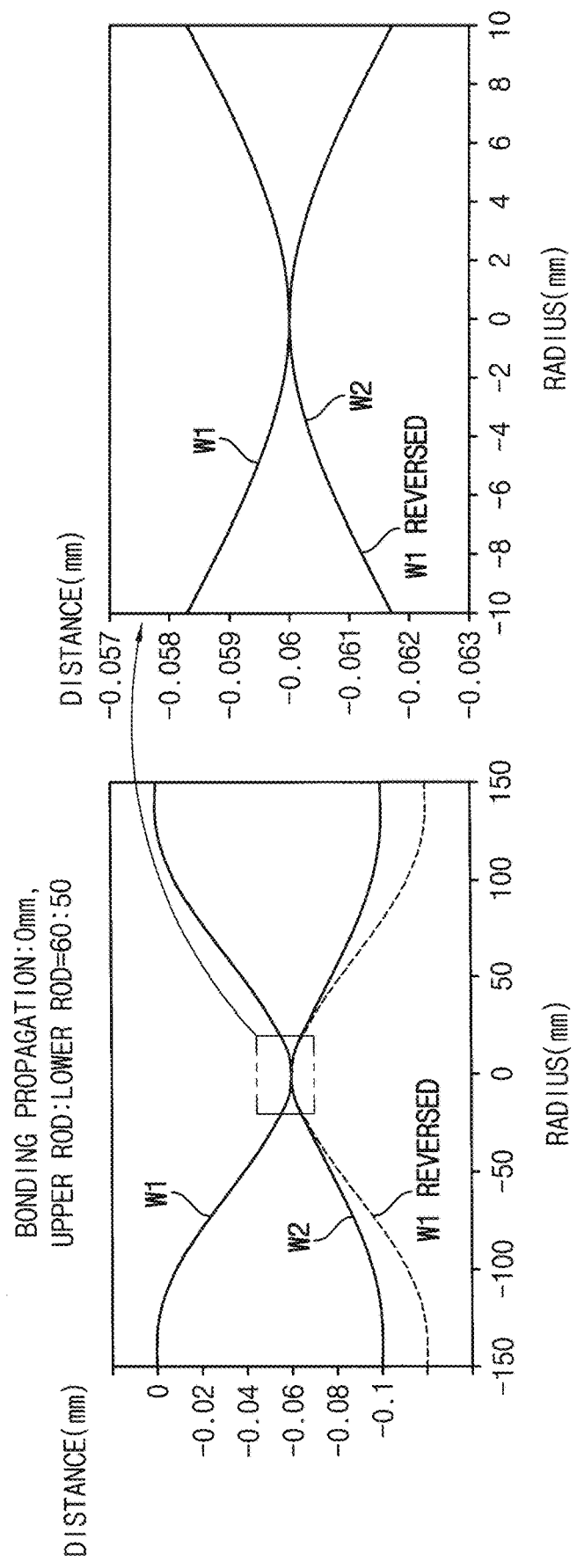
Figure 9A:
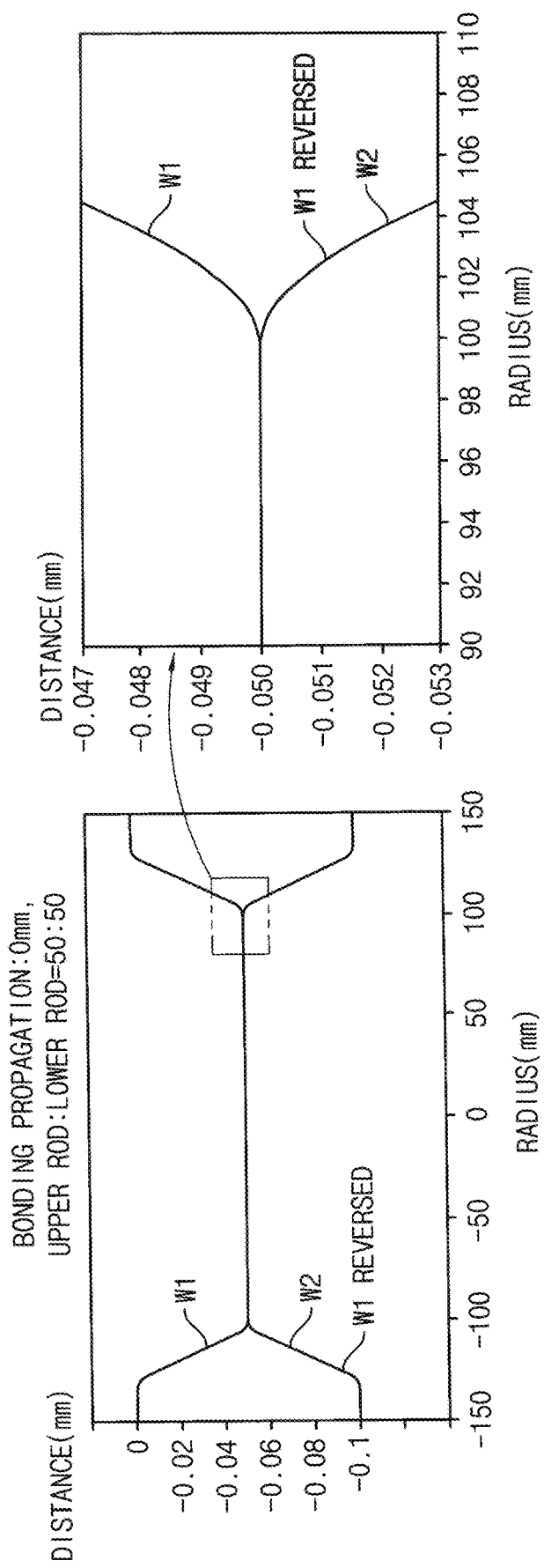
FIGS. 9A and 9B are graphs illustrating curvatures of the first and second wafers of the ratio of the protruding lengths of the lower push rod and the upper push rod at the bonding propagation time.
Figure 9B:
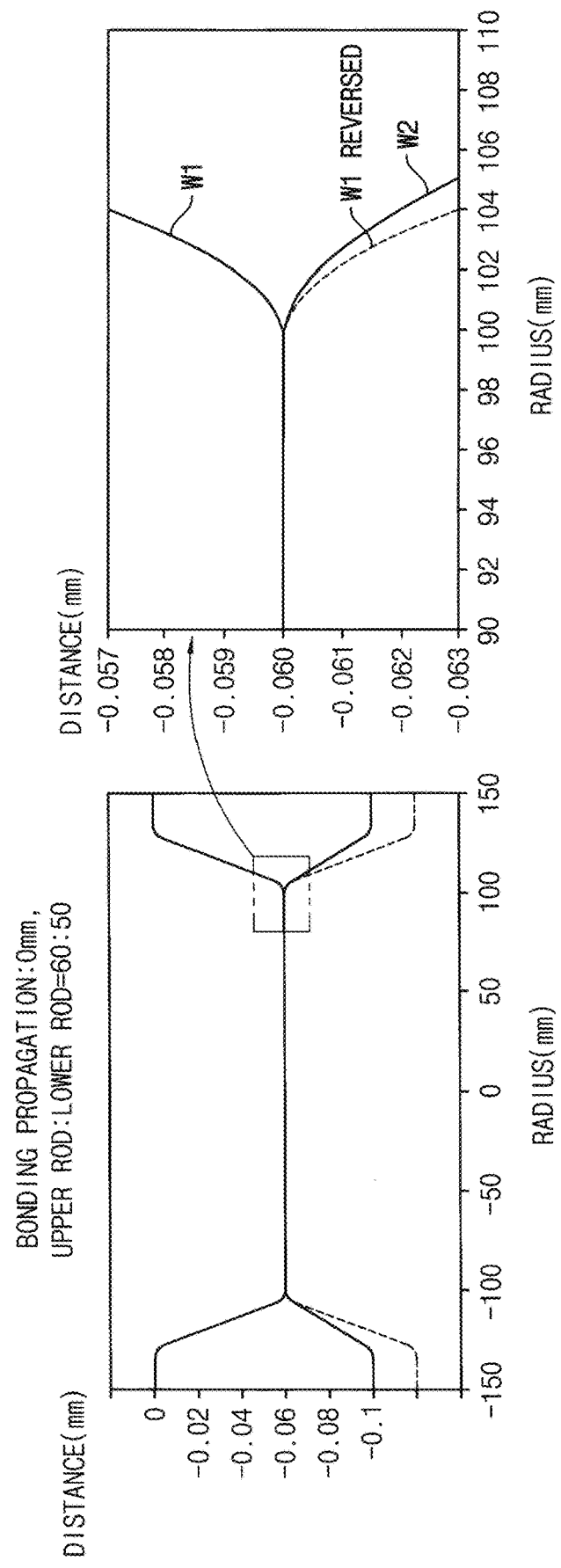

FIG. 7 is a graph illustrating a change in the ratio of the protruding lengths of the lower push rod and the upper push rod according to the bonding propagation in accordance with some example embodiments. FIGS. 8A and 8B are graphs illustrating curvatures of the first and second wafers according to the ratio of the protruding lengths of the lower push rod and the upper push rod at the bonding initial time. FIGS. 9A and 9B are graphs illustrating curvatures of the first and second wafers of the ratio of the protruding lengths of the lower push rod and the upper push rod at the bonding propagation time. The graphs in FIGS. 8A to 9B, W1 REVERSED represents a curvature symmetric to the curvature of the first wafer W1.

Referring to FIG. 7, in some example embodiments, the ratio of the protruding lengths (B/T) of the lower push rod 312 and the upper push rod 322 may be controlled to change according to the determined bonding propagation. For example, the ratio of the protruding lengths (B/T) of the lower push rod 312 and the upper push rod 322 may be controlled (e.g., based on control signals transmitted thereto from the controller 500) to increase gradually (e.g., increase over time continuously, at a constant or changing rate, in separate discrete step changes, or the like) according to the bonding propagation. The ratio of the protruding lengths (B/T) of the lower push rod 312 and the upper push rod 322 may be increased gradually according to the bonding propagation to secure symmetry at adhesion points of the first and second wafers, to thereby reduce or minimize (reduce) an alignment error.

Referring to FIG. 8A, at the bonding initial time, when the ratio of the protruding lengths of the lower push rod 312 and the upper push rod 322 is preset to 50:50, it may be shown that the curvatures at the adhesion points of the first and second wafers W1, W2 are asymmetric to each other. Since the pressurizing direction of the upper push rod 322 coincides with the gravity direction while the pressurizing direction of the lower push rod 312 is opposite to the gravity direction, when the ratio of the protruding lengths of the lower push rod 312 and the upper push rod 322 is preset to 50:50, it may be understood that the curvatures of the first and second wafers W1, W2 are asymmetric to each other.

Referring to FIG. 8B, at the bonding initial time, when the ratio of the protruding lengths of the lower push rod 312 and the upper push rod 322 is preset to 40:60, such that the protruding length B1 of the lower push rod 312 is less than the protruding length T1 of the upper push rod 322 at the bonding initial time, it may be shown that the curvatures at the adhesion points of the first and second wafers W1, W2 are symmetric to each other.

Accordingly, at the bonding initial time, the ratio of the protruding lengths of the lower push rod 312 and the upper push rod 322 may be preset to be asymmetric to each other, to thereby reduce or minimize (reduce) the alignment error between the wafers.

Referring to FIG. 9A, at the bonding propagation time that is subsequent to the bonding initial time, when the ratio of the protruding lengths of the lower push rod 312 and the upper push rod 322 is preset to 50:50 such that the protruding length B2 of the lower push rod 312 is equal to the protruding length T2 of the upper push rod 322 at the bonding propagation time, it may be shown that the curvatures at the adhesion points of the first and second wafers W1, W2 are symmetric to each other. In some example embodiments, at the bonding propagation time, the ratio of the protruding lengths of the lower push rod 312 and the upper push rod 322 may be preset to be greater than 50:50 such that the protruding length B2 of the lower push rod 312 is greater than the protruding length T2 of the upper push rod 322 at the bonding propagation time.

Referring to FIG. 9B, at the bonding propagation time, when the ratio of the protruding lengths of the lower push rod 312 and the upper push rod 322 is preset to 40:60, it may be shown that the curvatures at the adhesion points of the first and second wafers W1, W2 are asymmetric to each other.

Accordingly, at the bonding terminated time (e.g., a time at which the bonding propagation has extended to the edges of the first and second wafers W1, W2 such that the first and second wafers W1, W2 are completely bonded to each other), the ratio of the protruding lengths of the lower push rod 312 and the upper push rod 322 may be preset to be symmetric to each other, such that the controller 500 causes the protruding length of the lower push rod 312 to be equal to the protruding length of the upper push rod 322 at the bonding terminated time, to thereby reduce or minimize the alignment error between the wafers. In some example embodiments, the controller 500 may cause the protruding length of the lower push rod 312 to be greater than the protruding length of the upper push rod 322 at the bonding terminated time.

Figure 10A:
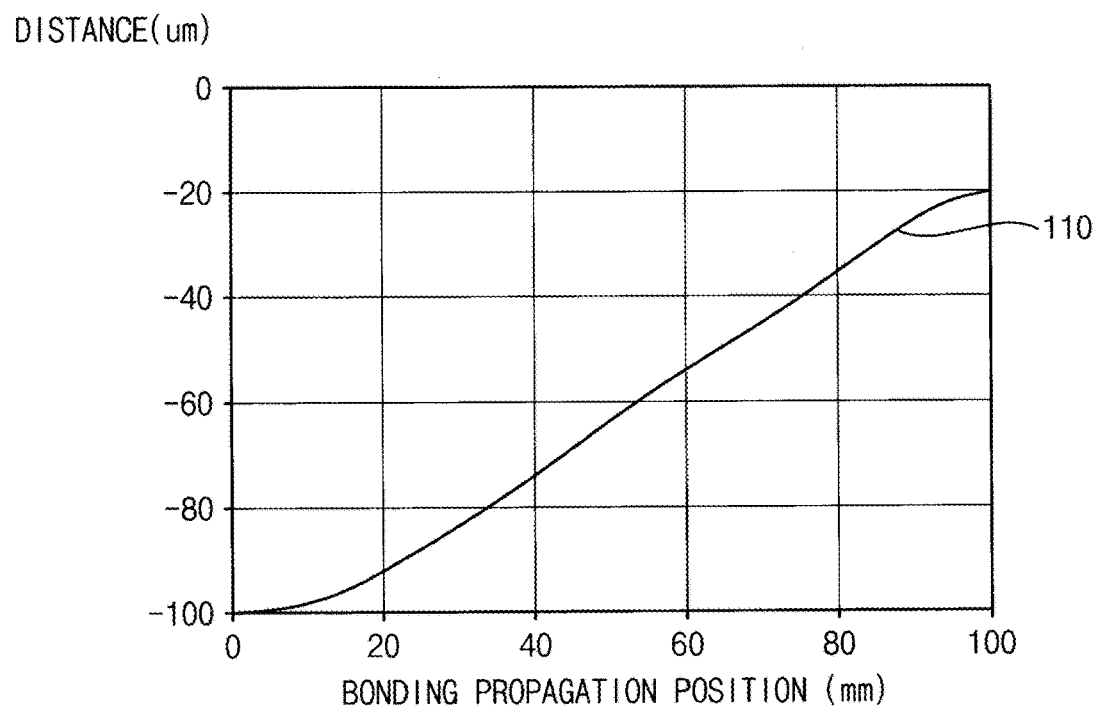
FIG. 10A is a graph illustrating a position of the lower stage according to the bonding propagation in accordance with some example embodiments.
Figure 10B:
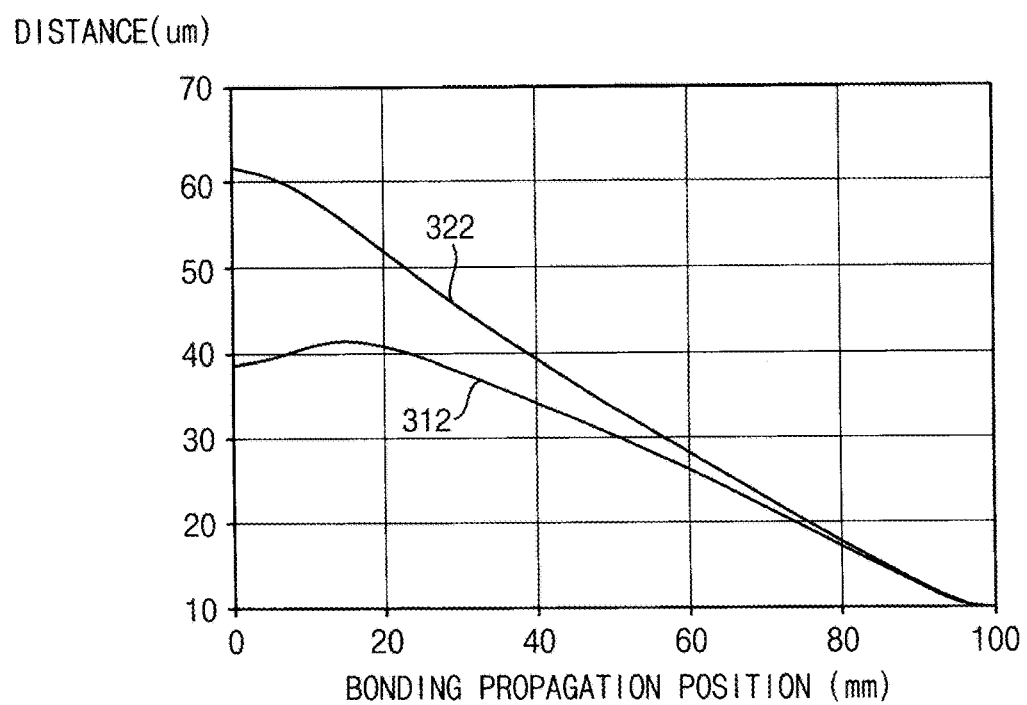
FIG. 10B is a graph illustrating protruding lengths of the lower push rod and the upper push rod according to the bonding propagation in accordance with some example embodiments.
Figure 11:
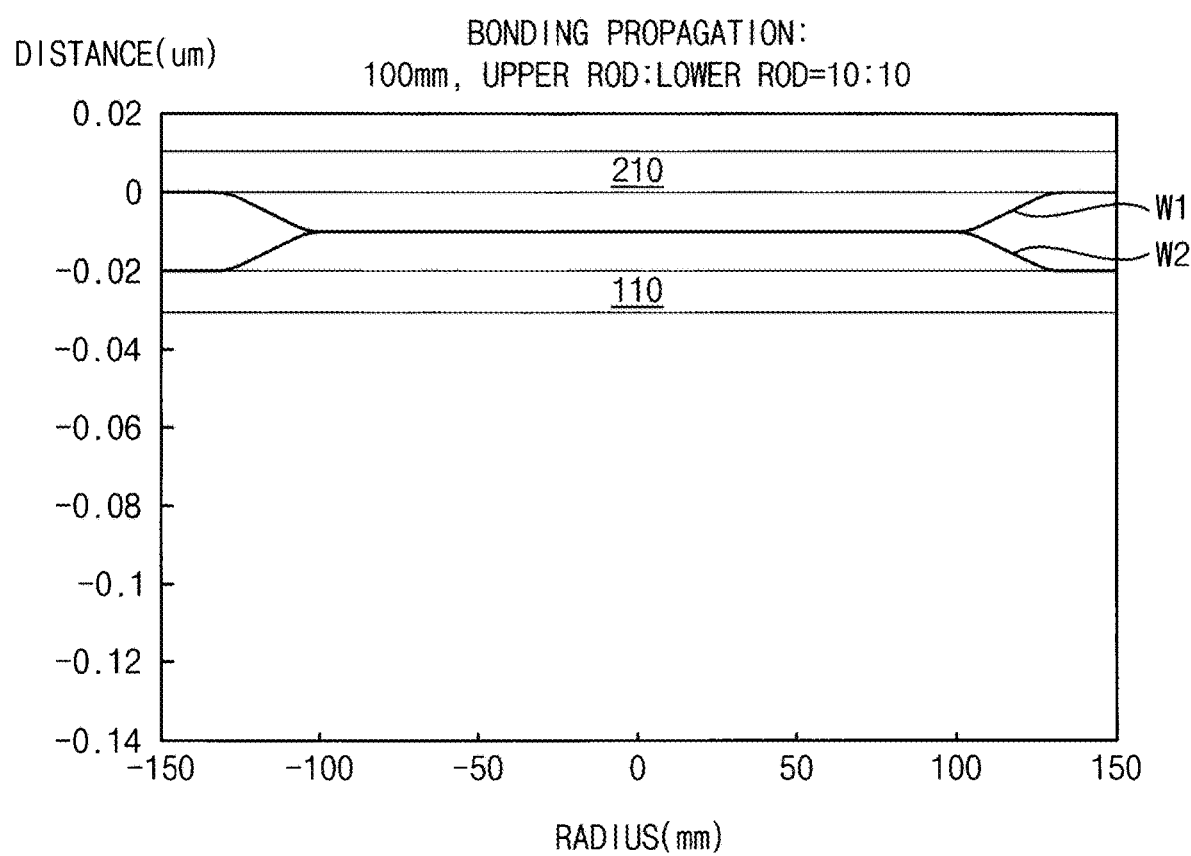

FIG. 10A is a graph illustrating a position of the lower stage according to the bonding propagation in accordance with some example embodiments, and FIG. 10B is a graph illustrating protruding lengths of the lower push rod and the upper push rod according to the bonding propagation in accordance with some example embodiments. FIG. 11 is a graph illustrating a distance between the lower stage and the upper stage at a bonding propagation position.

Referring to FIGS. 10A and 10B, in some example embodiments, the distance (G) between the lower stage 110 and the upper stage 210 may be controlled to change according to the bonding propagation. For example, the distance (G) between the lower stage 110 and the upper stage 210 may be controlled to decrease gradually (e.g., decrease over time continuously, at a constant or changing rate, in separate discrete step changes, or the like) according to the determined bonding propagation position. The distance (G) between the lower stage 110 and the upper stage 210 may be decreased gradually according to the bonding propagation, to thereby reduce or minimize (reduce) the alignment error.

Referring to FIG. 11, the distance (G) between the lower stage 110 and the upper stage 210 may be reduced from 100 mm at the bonding initial time to 20 mm at the bonding propagation position.

At the bonding terminated time, the vacuum suction of the upper stage 210 may be released to detach the second wafer W2 from the upper stage 210 such that the second wafer W2 drops onto the first wafer W1. Thus, the bonding of the peripheral region of the wafer (for example, R=100 mm~150 mm) may be terminated. In this case, when the second wafer W2 drops, an alignment error may occur due to fluidic dynamics characteristics. The lower stage 110 may be raised gradually during the bonding propagation, to thereby reduce the alignment occurring during the suction release at the bonding terminated time.

Figure 12A:
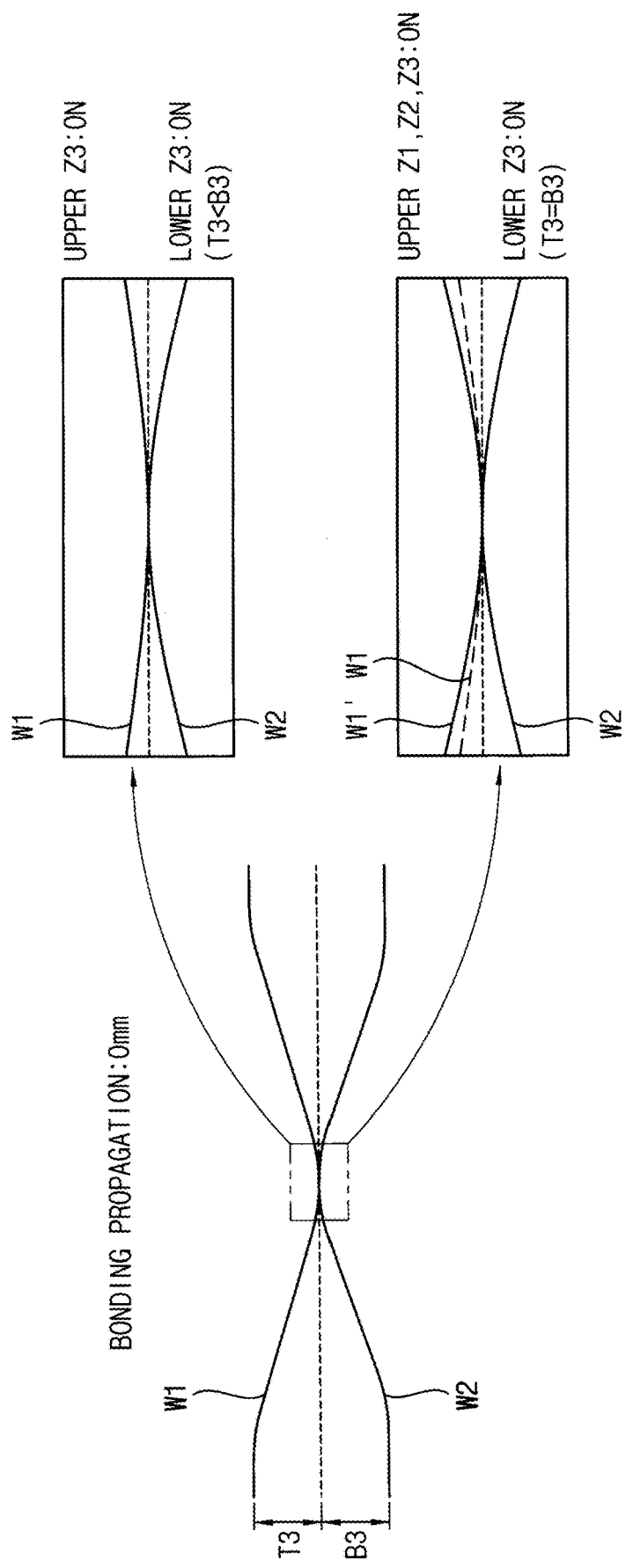
FIGS. 12A, 12B, and 12C are graphs illustrating curvatures of the first and second wafers according to the ratio of the suction area of the upper stage and the lower stage during the bonding propagation.
Figure 12B:
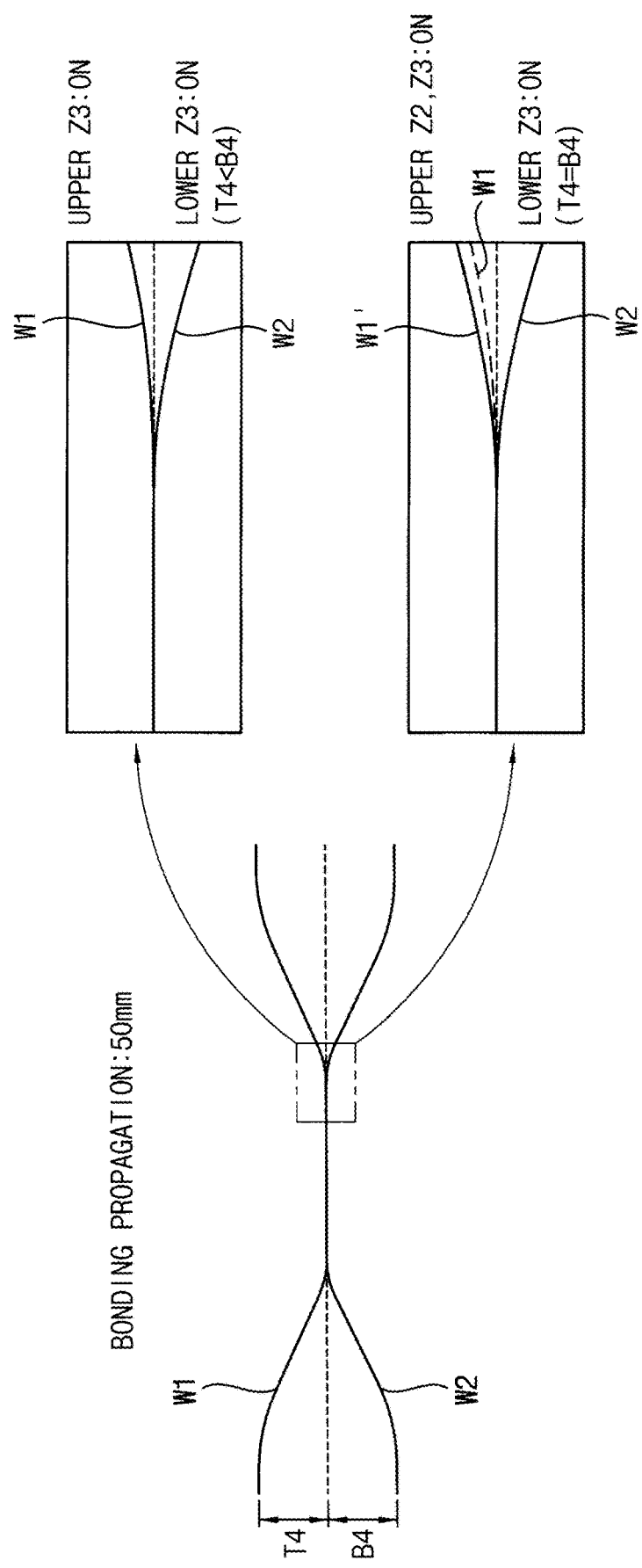
Figure 12C:
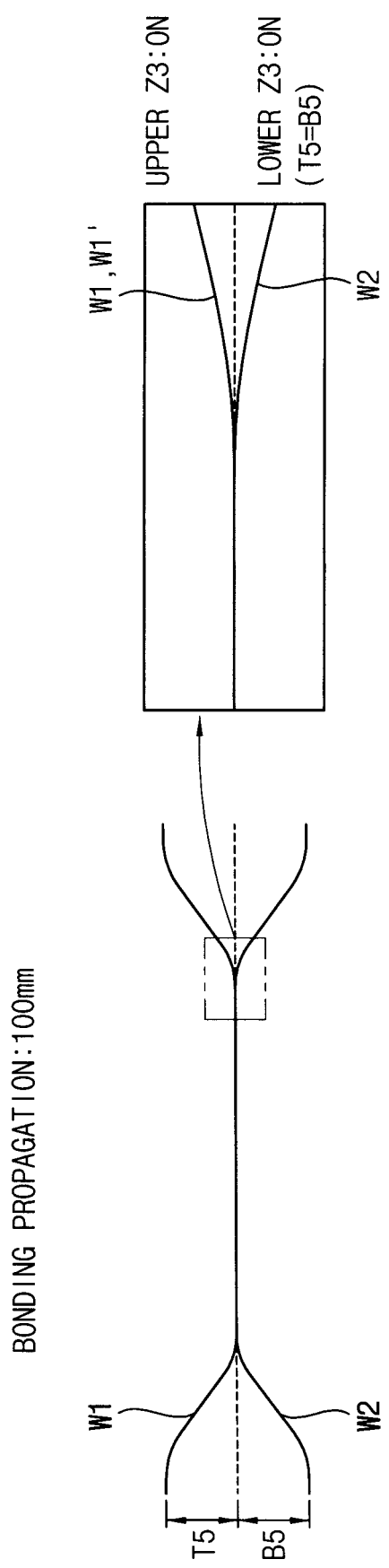

FIGS. 12A, 12B, and 12C are graphs illustrating curvatures of the first and second wafers according to the ratio of the suction area of the upper stage and the lower stage during the bonding propagation.

Referring to FIGS. 12A to 12C, the ratio of the suction area of the upper stage 210 and the lower stage 110 may be controlled to change (e.g., based on control signals transmitted by the controller 500 to the vacuum pump 240) according to the bonding propagation. For example, the ratio of the suction areas of the upper stage 210 and the lower stage 110 may be controlled to decrease gradually (e.g., decrease over time continuously, at a constant or changing rate, in separate discrete step changes, or the like) according to the determined bonding propagation position.

An upper right graph in FIG. 12A represents a case that at the bonding initial time, the vacuum pressure is supplied to the third suction portion Z3 of the upper stage 210 (Z3: ON) and the vacuum pressure is supplied to the third suction portion Z3 of the lower stage 110 (Z3: ON). In this case, it may be shown that the curvatures of the first and second wafers W1, W2 are asymmetric to each other (Here, the protruding length (B3) of the lower push rod 312 may be preset to be greater than the protruding length (T3) of the upper push rod 322).

A lower right graph in FIG. 12A represents a case that at the bonding initial time, the vacuum pressure is supplied to the first to third suction portions Z1, Z2, Z3 of the upper stage 210 (Z1, Z2, Z3: ON) and the vacuum pressure is supplied to the first to third suction portions Z1, Z2, Z3 of the lower stage 110 (Z1, Z2, Z3: ON). In this case, it may be shown that the curvatures of the first and second wafers W1, W2 are symmetric to each other (Here, the protruding length (B3) of the lower push rod 312 may be preset to be identical to the protruding length (T3) of the upper push rod 322).

An upper right graph in FIG. 12B represents a case that at the bonding middle time, the vacuum pressure is supplied to the third suction portion Z3 of the upper stage 210 (Z3: ON) and the vacuum pressure is supplied to the third suction portion Z3 of the lower stage 110 (Z3: ON). In this case, it may be shown that the curvatures of the first and second wafers W1, W2 are asymmetric to each other (Here, the protruding length (B4) of the lower push rod 312 may be preset to be greater than the protruding length (T4) of the upper push rod 322).

A lower right graph in FIG. 12B represents a case that at the bonding initial time, the vacuum pressure is supplied to the second and third suction portions Z2, Z3 of the upper stage 210 (Z2, Z3: ON) and the vacuum pressure is supplied to the third suction portion Z3 of the lower stage 110 (Z3: ON). In this case, it may be shown that the curvatures of the first and second wafers W1', W2 are symmetric to each other (Here, the protruding length (B4) of the lower push rod 312 may be preset to be identical to the protruding length (T4) of the upper push rod 322).

A right graph in FIG. 12C represents a case that at the bonding propagation time, the vacuum pressure is supplied to the third suction portion Z3 of the upper stage 210 (Z3: ON) and the vacuum pressure is supplied to the third suction portion Z3 of the lower stage 110 (Z3: ON). In this case, it may be shown that the curvatures of the first and second wafers W1, W2 are symmetric to each other (Here, the protruding length (B5) of the lower push rod 312 may be preset to be identical to the protruding length (T5) of the upper push rod 322).

A lower right graph in FIG. 12C represents a case that at the bonding initial time, the vacuum pressure is supplied to the second and third suction portions Z2, Z3 of the upper stage 210 (Z2, Z3: ON) and the vacuum pressure is supplied to the third suction portion Z3 of the lower stage 110 (Z3: ON). In this case, it may be shown that the curvatures of the first and second wafers W1', W2 are symmetric to each other (Here, the protruding length (B4) of the lower push rod 312 may be preset to be identical to the protruding length (T4) of the upper push rod 322).

In some example embodiments, at the bonding initial time, the suction area in the peripheral region of the upper stage 210 may be preset to be greater than the suction are in the peripheral region of the lower stage 110, and according to the bonding propagation, the suction area in the peripheral region of the upper stage 210 may be controlled to decrease relatively and the suction area in the peripheral region of the lower stage 110 may be controlled to be maintained. Thus, asymmetric deformations between the first wafer W1 and the second wafer W2 according to the bonding propagation may be compensated.

Hereinafter, a wafer to wafer bonding method using the wafer bonding system in FIG. 1 will be described.

Figure 13:
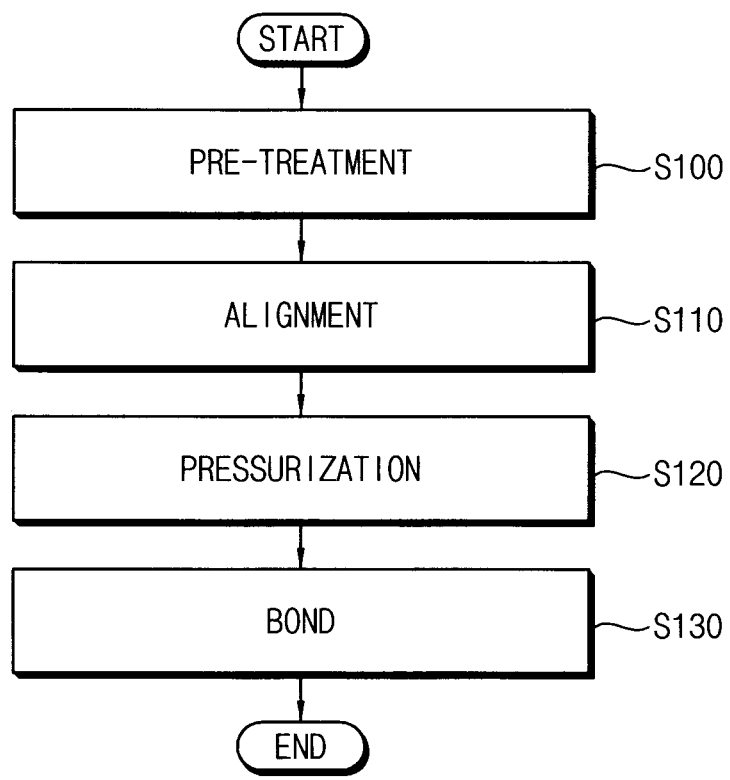
Figure 14:
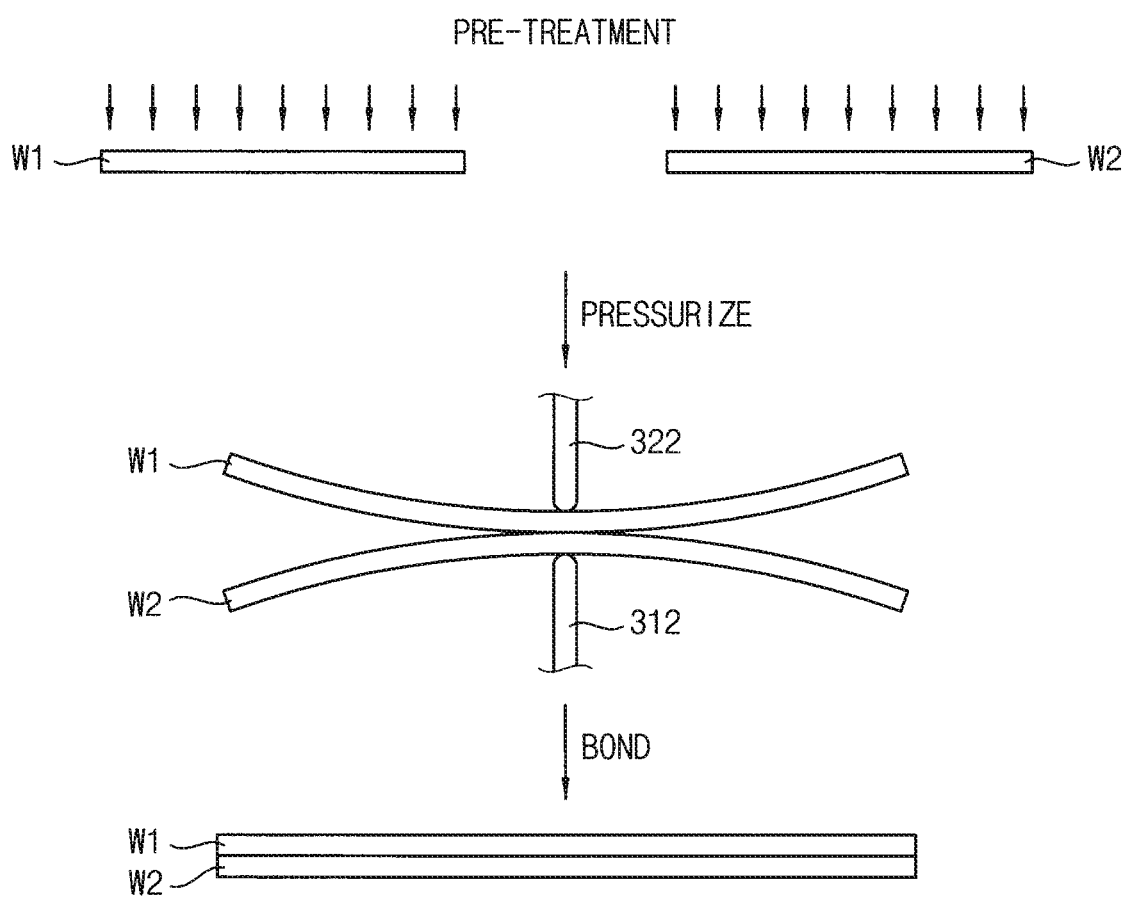
Figure 15:
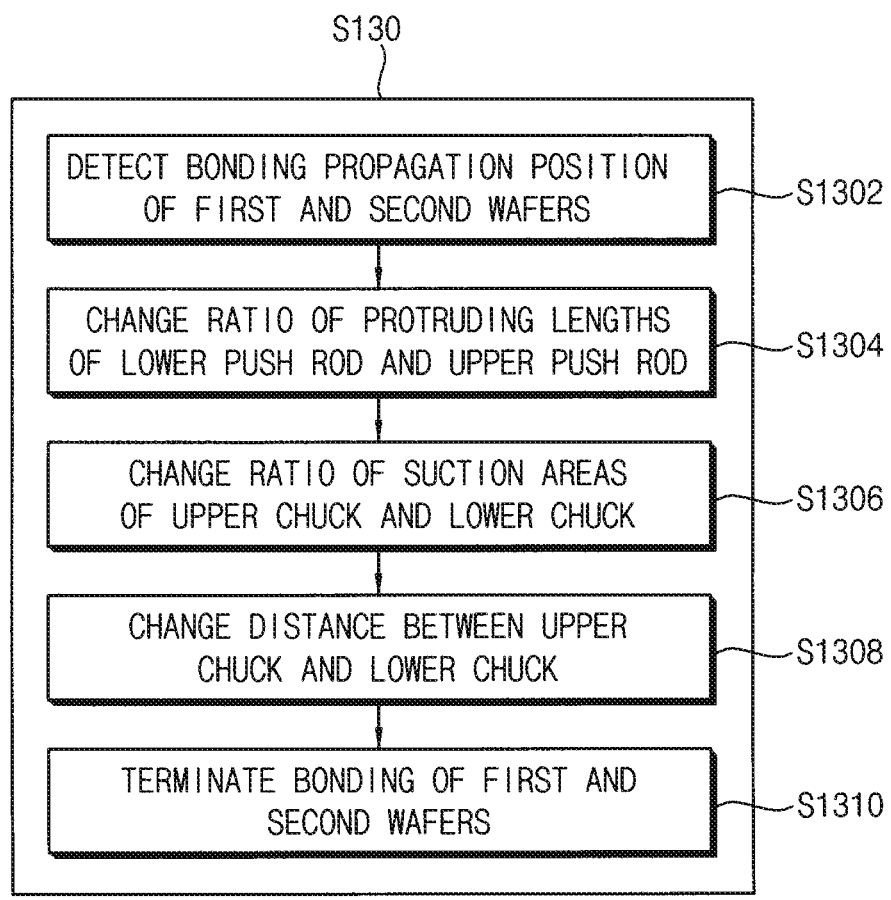

FIG. 13 is a flowchart illustrating a wafer to wafer bonding method in accordance with some example embodiments. FIG. 14 is a view illustrating the wafer to wafer bonding method in FIG. 13. FIG. 15 is a flowchart illustrating a bonding stage of the wafer to wafer bonding method in FIG. 13.

Referring to FIGS. 1, 2, 3 and 13 to 15, first, a pre-treatment may be performed on at least one of bonding surfaces of wafers to be bonded to each other (S100).

In some example embodiments, the wafer W1, W2 may be loaded into a chamber of the plasma processing apparatus 40, a plasma gas may be supplied on the wafer W1, W2 through a shower head, and a plasma process may then be performed within the chamber.

Then, the surface of the wafer that has been plasma-processed may be cleaned. DI water may be coated on the wafer surface using a spin coater of the cleaning apparatus. The DI water may clean the wafer surface and allow —OH radical to be bonded easily on the wafer surface, such that dangling bonds are easily created on the wafer surface.

Then, the pre-treatment processed wafers W1, W2 may be aligned (S110) and the middle portions of the wafers W1, W2 may be pressurized such that the middle portions of the wafers protrude (S120), and then, the wafers may be gradually joined from the middle portion to a peripheral region such that the wafers W1 and W2 are joined (S130).

In some example embodiments, the pre-treatment processed first and second wafers W1, W2 may be suctioned to be held on the lower stage 110 and the upper stage 210 respectively. The first wafer W1 may be vacuum suctioned by the first suction holes 130 formed in the lower stage 110. The second wafer W2 may be vacuum suctioned by the second suction holes 230 formed in the upper stage 210.

Then, the lower push rod 312 may ascend toward the upper stage 210 to pressurize the middle portion of the first wafer W1. Thus, the middle portion of the first wafer W1 may be detached from the first surface 112 of the lower stage 110 to protrude upward more than the peripheral region. At the same time, the upper push rod 322 may descent toward the lower stage 110 to pressurize the middle portion of the second wafer W2. Thus, the middle portion of the second wafer W2 may be detached from the second surface 212 of the upper stage 210 to protrude downward more than the peripheral region.

When the first wafer W1 bends upward such that it is upwardly concave and the second wafer W2 bends downward such that it is downwardly concave, the lower stage 110 may travel upward such that the first wafer W1 contacts the second wafer W2. If the middle portion of the first wafer W1 initially contacts the middle portion of the second wafer W2, the bonding is started.

At an initial time of the bonding, the lower push rod 312 may have a first protruding length B1 from the lower stage 110 and the upper push rod 322 may have a first protruding length T1. For example, the ratio of the protruding lengths of the lower push rod 312 and the upper push rod 322 may be preset to 40:60. In here, the distance (G) between the lower stage 110 and the upper stage 210 may be maintained to about 100 mm.

Additionally, at the bonding initial time, vacuum pressure may be applied to the first to third suction portions Z1, Z2, Z3 of the upper stage 210 (Z1, Z2, Z3: ON) and vacuum pressure may be applied to the third suction portion Z3 of the lower stage 110 (Z3: ON). Thus, a suction region of a first suction area may be formed in the peripheral region of the upper stage 210, and a suction region of a third suction area less than the first suction area may be formed in the peripheral region of the lower stage 110.

Then, as illustrated in FIG. 15, a bonding propagation position of the first wafer W1 and the second wafer W2 may be detected by the position detection sensor 400 (S1302) at a bonding propagation time.

For example, the position detection sensor 400 may include a vision camera. The vision camera may detect a deformation of the second wafer W2 through a detection hole 216 formed in the upper stage 210. The detection hole 216 may be positioned within a range between 0.25 R to 0.75 R of the radius (R) from the center of the upper stage 210. In case that the wafer has a diameter of 300 mm, the detection hole 216 may have an inner radius of about 40 mm and an outer radius of about 110 mm from the center of the upper stage 210. Accordingly, the bonding propagation position in the range between 40 mm and 110 mm from the center of the upper stage 210 may be detected using the vision camera.

Then, the ratio of the protruding lengths (B/T) of the lower push rod 312 and the upper push rod 322 may be controlled to change according to the bonding propagation (S1304).

For example, the ratio of the protruding lengths (B/T) of the lower push rod 312 and the upper push rod 322 may be controlled to increase gradually according to the bonding propagation. The ratio of the protruding lengths (B/T) of the lower push rod 312 and the upper push rod 322 may be increased gradually according to the bonding propagation to secure symmetry at adhesion points of the first and second wafers W1, W2, to thereby reduce or minimize (reduce) an alignment error.

Additionally, the ratio of the suction area of the upper stage 210 and the lower stage 110 may be controlled to change according to the bonding propagation (S1306).

For example, the ratio of the suction areas in the peripheral regions of the upper stage 210 and the lower stage 110 (upper stage suction area/lower stage suction area) may be controlled to decrease gradually according to the bonding propagation. The ration of the suction areas of the upper stage 210 and the lower stage 110 may be decreased gradually according to the bonding propagation position to secure symmetry at the adhesion points of the first and second wafers W1, W2, to thereby reduce or minimize (reduce) an alignment error.

Additionally, the distance (G) between the lower stage 110 and the upper stage 210 may be controlled to change according to the bonding propagation (S1308).

For example, the distance (G) between the lower stage 110 and the upper stage 210 may be controlled to decrease gradually according to the bonding propagation. The distance (G) between the lower stage 110 and the upper stage 210 may be decreased gradually according to the bonding propagation, to thereby reduce or minimize (reduce) the alignment error.

At the bonding propagation position, the lower push rod 312 may have a second protruding length B2 from the lower stage 110 and the upper push rod 322 may have a second protruding length T2. For example, at the bonding propagation position, the ratio of the protruding lengths (B/T) of the lower push rod 312 and the upper push rod 322 may be preset to 50:50 or 60:40. In here, the distance (G) between the lower stage 110 and the upper stage 210 may be maintained to about 20 mm.

Additionally, at the bonding propagation position, vacuum pressure may be applied to the third suction portions Z3 of the upper stage 210 and the lower stage 110 (Z3: ON). Thus, the suction region formed in the peripheral regions of the upper stage 210 and the suction region formed in the peripheral region of the upper stage 210 may have the same suction area.

As mentioned above, while the bonding of the upper wafer and the lower wafer propagates radially outwards, the ratio of the protruding lengths (B/T) of the lower push rod 312 and the upper push rod 322, the ratio of the suction areas of the lower stage 110 and the upper stage 210, and the distance (G) between the lower stage 110 and the upper stage 210 may be changed.

Additionally, at the bonding termination time, the bonding propagation may have proceeded to the edges of the first and second wafers W1, W2 such that a bonding process is complete and thus is terminated (S1310).

Thus, while the bonding of the upper wafer and the lower wafer propagates, curvatures of the wafers at the adhesion points may be controlled to be symmetric to each other to thereby reduce or minimize (reduce) an alignment error between the wafers, thereby improving the performance, reliability, structure, or the like of semiconductor devices formed via the wafer bonding.

The above-described wafer to wafer bonding system and wafer to wafer bonding method may be used to manufacture, for example, semiconductor packages or image sensors including logic devices and memory devices. For example, the semiconductor packages may include volatile memory devices such as DRAM devices and SRAM devices, or non-volatile memory devices such as flash memory devices, PRAM devices, MRAM devices, ReRAM devices, etc. The image sensor may include a CMOS image sensor.

The foregoing is illustrative of some example embodiments and is not to be construed as limiting thereof. Although a few some example embodiments have been described, those skilled in the art will readily appreciate that many modifications are possible in some example embodiments without materially departing from the novel teachings and advantages of the present inventive concepts. Accordingly, all such modifications are intended to be included within the scope of some example embodiments as defined in the claims.

What is claimed is:

1. A wafer bonding apparatus, comprising:
    a vacuum pump;
    a lower stage having a first surface and including a plurality of first suction holes in the first surface, wherein the lower stage is configured to vacuum suction a first wafer on the first surface based on a vacuum pressure being supplied to the plurality of first suction holes from the vacuum pump;
    an upper stage having a second surface and including a plurality of second suction holes in the second surface, wherein the upper stage is configured to vacuum suction a second wafer on the second surface based on the vacuum pressure being supplied to the plurality of second suction holes from the vacuum pump;
    a lower push rod movable through a first center hole in a middle portion of the lower stage to contact and apply pressure to a middle region of the first wafer that overlaps with the first center hole;
    an upper push rod movable through a second center hole in a middle portion of the upper stage to contact and apply pressure to a middle region of the second wafer that overlaps with the second center hole;
    a position detection sensor configured to generate wafer position information indicating a bonding propagation position of the first wafer and the second wafer based on detecting at least one of the first wafer or the second wafer through a detection hole in at least one stage of the lower stage or the upper stage;
    a stage driver configured to cause the lower stage and the upper stage to move in relation to each other;
    a push rod driver configured to move the lower push rod and the upper push rod in a vertical direction;
    a wherein the vacuum pump is configured to selectively supply the vacuum pressure to both the first suction holes and the second suction holes; and
    processing circuitry configured to control operations of the stage driver, the push rod driver, and the vacuum pump, the processing circuitry further configured to process the wafer position information to detect the bonding propagation position, the processing circuitry further configured to cause a change, according to the bonding propagation position, of at least one of
        a ratio of protruding lengths of the lower push rod and the upper push rod, or
        a ratio of suction areas of the upper stage and the lower stage.

2. The wafer bonding apparatus of claim 1, wherein the processing circuitry is configured to cause the ratio of the protruding lengths of the lower push rod and the upper push rod to increase over time according to the bonding propagation position.

3. The wafer bonding apparatus of claim 2, wherein the processing circuitry is configured to cause the ratio of the protruding lengths of the lower push rod and the upper push rod to increase over time according to the bonding propagation position such that
    at a bonding initial time, the protruding length of the lower push rod is less than the protruding length of the upper push rod, and
    at a bonding propagation time that is subsequent to the bonding initial time, the protruding length of the lower push rod is equal to or greater than the protruding length of the upper push rod.

4. The wafer bonding apparatus of claim 1, wherein the position detection sensor includes a vision camera.

5. The wafer bonding apparatus of claim 1, wherein the detection hole is positioned within a range between 0.25 R to 0.75 R of a radius (R) from a center of the upper stage to an outer edge of the upper stage or from a center of the lower stage to an outer edge of the lower stage.

6. The wafer bonding apparatus of claim 1, wherein the processing circuitry is configured to cause the ratio of the suction areas of the upper stage and the lower stage over time according to the bonding propagation position.

7. The wafer bonding apparatus of claim 6, wherein the processing circuitry is configured to cause the ratio of the suction areas of the upper stage and the lower stage to decrease over time according to the bonding propagation position such that
    at a bonding initial time, a first suction area is formed in a peripheral region of the upper stage and a second suction area having an area that is less than the first suction area is formed in a peripheral region of the lower stage, and
    at a bonding propagation time that is subsequent to the bonding initial time, a third suction area having an area that is equal to or less than the second suction area is formed in the peripheral region of the upper stage and a fourth suction area having an area that is equal to the second suction area is formed in the peripheral region of the lower stage.

8. The wafer bonding apparatus of claim 1, wherein the processing circuitry is configured to cause a distance between the lower stage and the upper stage to change according to the bonding propagation position.

9. The wafer bonding apparatus of claim 8, wherein the processing circuitry is configured to cause the distance between the lower stage and the upper stage to change over time according to the bonding propagation position.

10. The wafer bonding apparatus of claim 1, wherein
    the first suction holes extend annularly around a center of the lower stage and are at least 0.8 R of a radius (R) from the center of the lower stage to an outer edge of the lower stage, and
    the second suction holes extend annularly around a center of the upper stage and are at least 0.8 R of a radius (R) from the center of the upper stage to an outer edge of the upper stage.

11. A wafer bonding apparatus, comprising:
    a lower stage having a first surface and including a plurality of first suction holes in the first surface, wherein the lower stage is configured to vacuum suction a first wafer on the first surface based on a vacuum pressure being supplied to the plurality of first suction holes from a vacuum pump;
    an upper stage having a second surface and including a plurality of second suction holes in the second surface, wherein the upper stage is configured to vacuum suction a second wafer on the second surface based on the vacuum pressure being supplied to the plurality of second suction holes from the vacuum pump;

a lower push rod movable through a first center hole in a middle portion of the lower stage to contact and apply pressure to a middle region of the first wafer that overlaps with the first center hole;

an upper push rod movable through a second center hole in a middle portion of the upper stage to contact and apply pressure to a middle region of the second wafer that overlaps with the second center hole;

a position detection sensor configured to generate wafer position information indicating a bonding propagation position of the first wafer and the second wafer based on detecting at least one of the first wafer or the second wafer through a detection hole in at least one stage of the lower stage or the upper stage; and a processing circuitry configured to process the wafer position information to detect the bonding propagation position, the processing circuitry further configured to cause a change, according to the bonding propagation position, of at least one of a ratio of protruding lengths of the lower push rod and the upper push rod, or a ratio of suction areas of the upper stage and the lower stage, wherein the detection hole is positioned within a range between 0.25 R to 0.75 R of a radius (R) from a center of the upper stage to an outer edge of the upper stage or from a center of the lower stage to an outer edge of the lower stage.

12. The wafer bonding apparatus of claim 11, further comprising:

a lower push rod driver configured to move the lower push rod according to a control signal generated by the processing circuitry; and an upper push rod driver configured to move the upper push rod according to a separate control signal generated by the processing circuitry.

13. The wafer bonding apparatus of claim 11, wherein the processing circuitry is configured to cause the ratio of the protruding lengths of the lower push rod and the upper push rod to increase over time according to the bonding propagation position.

14. The wafer bonding apparatus of claim 13, wherein the processing circuitry is configured to control the protruding length of the lower push rod and the protruding length of the upper push rod such that, at a bonding initial time, the protruding length of the lower push rod is less than the protruding length of the upper push rod, and at a bonding terminated time that is subsequent to the bonding initial time, the protruding length of the lower push rod is identical to or greater than the protruding length of the upper push rod.

15. The wafer bonding apparatus of claim 11, wherein the position detection sensor includes a vision camera.

16. The wafer bonding apparatus of claim 11, wherein the processing circuitry is configured to cause the ratio of the suction areas of the upper stage and the lower stage to decrease over time according to the bonding propagation position.

17. The wafer bonding apparatus of claim 16, wherein the processing circuitry is configured to cause the ratio of the suction areas of the upper stage and the lower stage to decrease over time according to the bonding propagation position such that at a bonding initial time, a first suction area is formed in a peripheral region of the upper stage and a second suction area having an area that is less than the first suction area is formed in a peripheral region of the lower stage, and at a bonding propagation time that is subsequent to the bonding initial time, a third suction area having an area that is equal to or less than the second suction area is formed in the peripheral region of the upper stage and a fourth suction area having an area that is equal to the second suction area is formed in the peripheral region of the lower stage.

18. The wafer bonding apparatus of claim 11, wherein the processing circuitry is configured to cause a distance between the lower stage and the upper stage to change according to the bonding propagation position.

19. The wafer bonding apparatus of claim 18, wherein the processing circuitry is configured to cause the distance between the lower stage and the upper stage to change over time according to the bonding propagation position.

20. The wafer bonding apparatus of claim 11, wherein the first suction holes extend annularly around the center of the lower stage and are at least 0.8 R of a radius (R) from the center of the lower stage to the outer edge of the lower stage, and the second suction holes extend annularly around the center of the upper stage and are at least 0.8 R of a radius (R) from the center of the upper stage to the outer edge of the upper stage.

\* \* \* \* \*